United States Patent
Subramanian et al.

(10) Patent No.: US 11,955,965 B1
(45) Date of Patent: Apr. 9, 2024

(54) TECHNOLOGIES FOR A HIGH-VOLTAGE TRANSMISSION GATE

(71) Applicant: Intel Corporation, Santa Clara, CA (US)

(72) Inventors: Sushil Subramanian, Beaverton, OR (US); Stefano Pellerano, Beaverton, OR (US); Todor Mladenov, Portland, OR (US); JongSeok Park, Hillsboro, OR (US); Bishnu Prasad Patra, Zoetermeer (NL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/827,590

(22) Filed: May 27, 2022

(51) Int. Cl.
*H03K 17/693* (2006.01)
*G06N 10/40* (2022.01)
*H03K 17/687* (2006.01)

(52) U.S. Cl.
CPC .......... *H03K 17/693* (2013.01); *G06N 10/40* (2022.01); *H03K 17/6874* (2013.01)

(58) Field of Classification Search
CPC ...... G06N 10/00; G06N 10/40; H03K 17/693; H03K 17/6874; H03K 2217/0054
See application file for complete search history.

(56) References Cited

U.S. PATENT DOCUMENTS

| | | | | |
|---|---|---|---|---|
| 5,739,716 A * | 4/1998 | Kwak | ................ | H03K 17/6872 327/427 |
| 7,180,078 B2 * | 2/2007 | Pau | ......................... | H01J 49/42 250/378 |
| 7,835,124 B2 * | 11/2010 | Siddhartha | ....... | H03K 19/00315 361/111 |
| 7,911,265 B2 * | 3/2011 | Dzurak | .................... | H03K 3/38 327/527 |
| 8,238,845 B2 * | 8/2012 | Hurwitz | .............. | H04L 27/3818 455/104 |
| 9,184,763 B2 | 11/2015 | Kuttner et al. | | |
| 10,601,216 B2 * | 3/2020 | Muench | .......... | H03K 17/08122 |
| 2012/0299637 A1 * | 11/2012 | Company Bosch | . | H03K 17/063 327/437 |

OTHER PUBLICATIONS

USPTO; U.S. Appl. No. 17/827,570, filed May 27, 2022; 42 pages.
Wikipedia; "Transmission Gate," accessed on the Internet at https://en.wikipedia.org/wiki/Transmission_gate; page version Mar. 28, 2022; 4 pages.

* cited by examiner

*Primary Examiner* — Ryan Johnson
*Assistant Examiner* — Colleen J O Toole
(74) *Attorney, Agent, or Firm* — Alliance IP, LLC

(57) ABSTRACT

Technologies for a high-voltage transmission gate are disclosed. In the illustrative embodiment, a companion chip is connected to a quantum processor. The companion chip provides voltages to gates of qubits on the quantum processor. The companion chip includes one or more high-voltage transmission gates that can be used to charge capacitors linked to gates of qubits on the quantum processor. The transmission gate includes transistors with a breakdown voltage less than a range of input and output voltages of the transmission gate. Control circuitry on the companion chip controls the voltages applied to transistors of the transmission gate to ensure that the voltage differences across the terminals of each transistor is below a breakdown voltage.

25 Claims, 15 Drawing Sheets

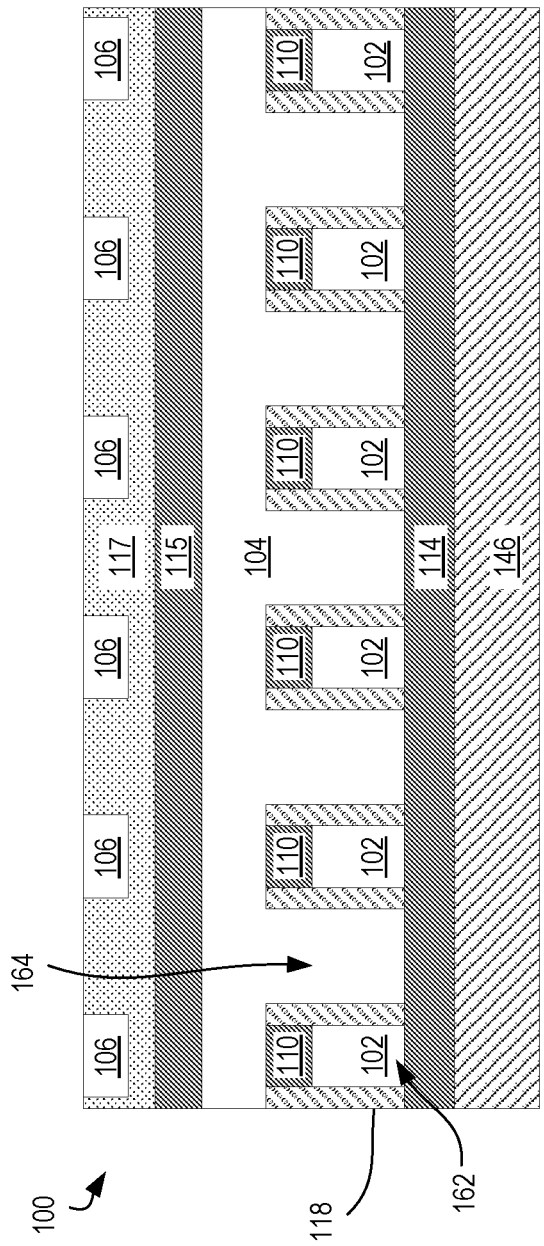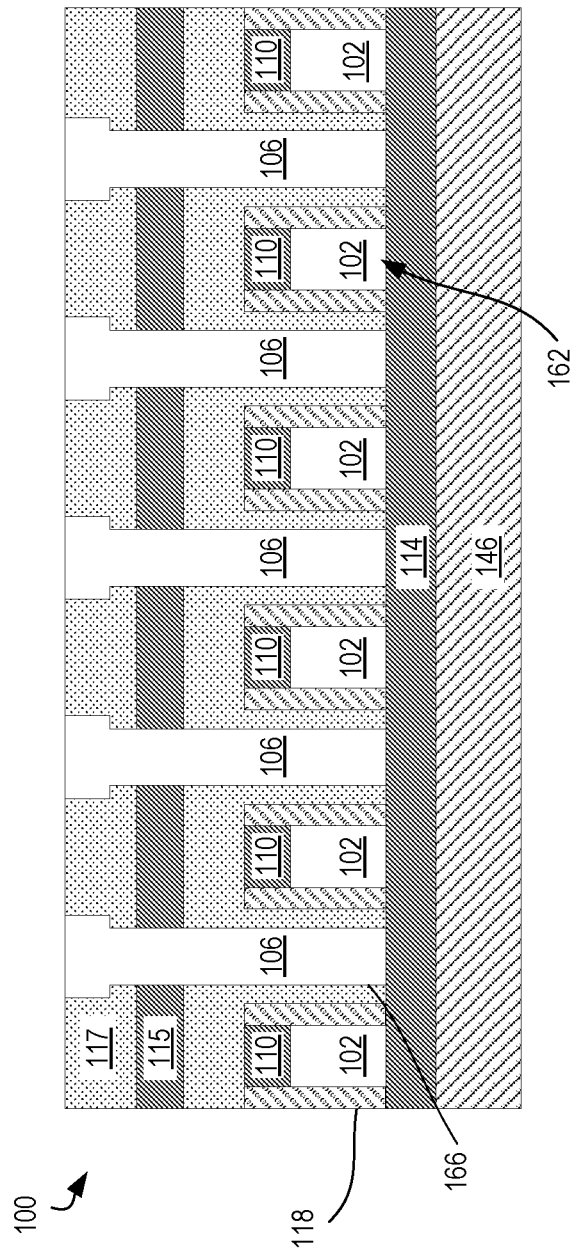

TECHNOLOGIES FOR A HIGH-VOLTAGE TRANSMISSION GATE

BACKGROUND

Quantum computers promise computational abilities not feasible with classical computing. One of many challenges in quantum computing is transmitting and receiving a large number of signals to and from qubits of the quantum processor. In order to reduce the number of cables required to connect to the quantum processor, a larger number of signals may be multiplexed onto fewer cables, reducing the number of connections to the quantum processor.

BRIEF DESCRIPTION OF THE DRAWINGS

FIGS. 1A-1F illustrate various views of an example quantum compute device, in accordance with one embodiment.

DETAILED DESCRIPTION

Figure 1A:
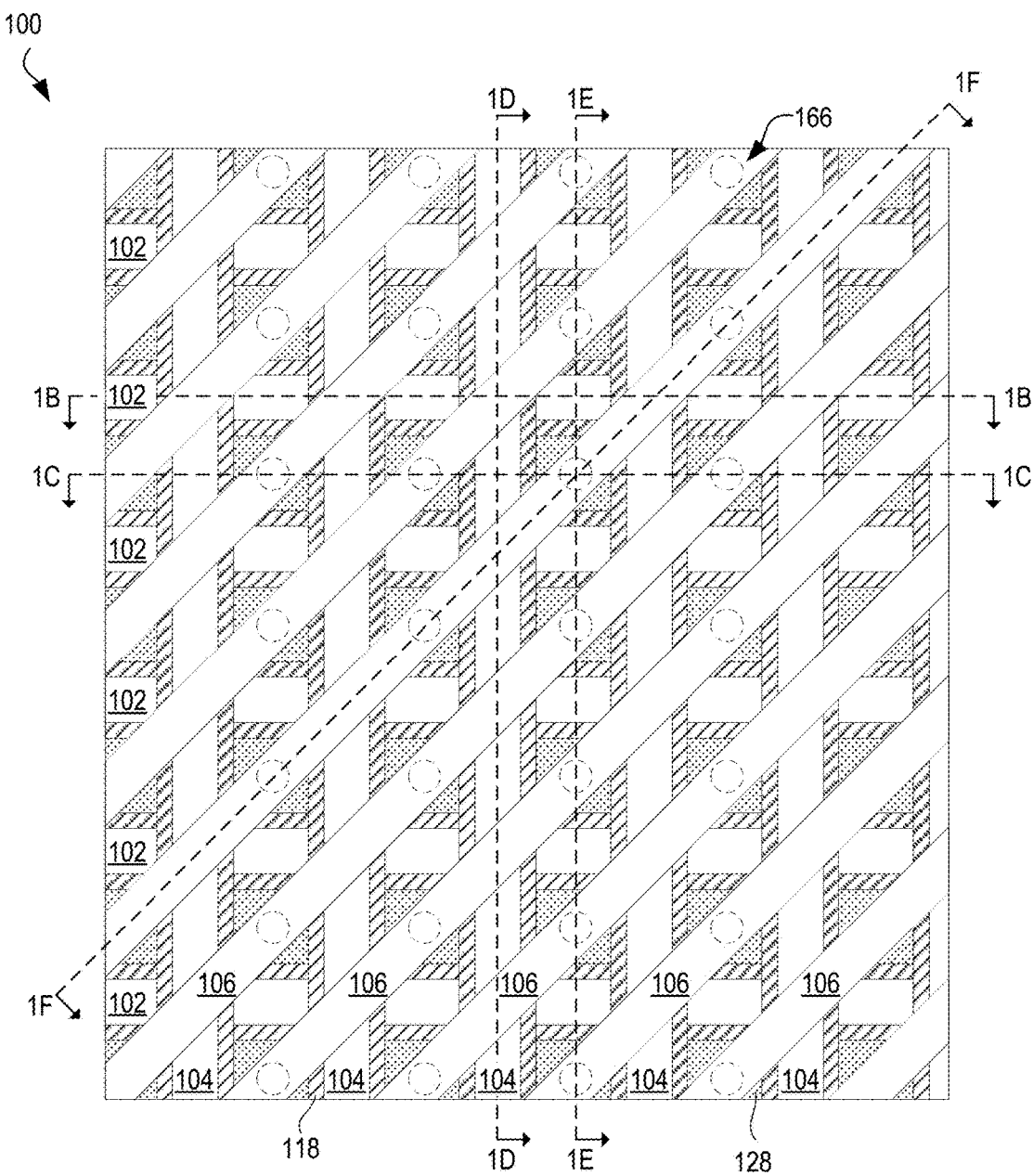

Aspects of the present disclosure may include a companion die to a quantum processor die. The illustrative companion die includes one or more high-voltage transmission gates. In use, in one embodiment, the transmission gates can transmit a voltage that is up to two times a breakdown voltage of the transistors that make up the transmission gate. The high-voltage transmission gate can be used to allow a digital-to-analog converter (DAC) to charge a capacitor on the die, which can be used to apply a voltage to a gate of a qubit in the quantum processor.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

References are made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

A quantum computer uses quantum-mechanical phenomena such as superposition and entanglement to perform computations, simulations, or other functions. In contrast to digital computers, which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin." Qubits in quantum mechanical systems can be in a superposition of both states at the same time, a trait that is unique and fundamental to quantum computing.

Quantum computing systems execute algorithms containing quantum logic operations performed on qubits. In some cases, the result of the algorithm is not deterministic. The quantum algorithm may be repeated many times in order to determine a statistical distribution of results or in order to have a high likelihood of finding the correct answer. In some cases, a classical algorithm may be used to check if the quantum computer determined the correct result.

Qubits have been implemented using a variety of different technologies which are capable of manipulating and reading quantum states. These include but are not limited to quantum dot devices (spin-based and spatial-based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer, including, but not limited to, those listed above. The particular physical implementation used for qubits is not necessarily required for the embodiments of the invention described herein.

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
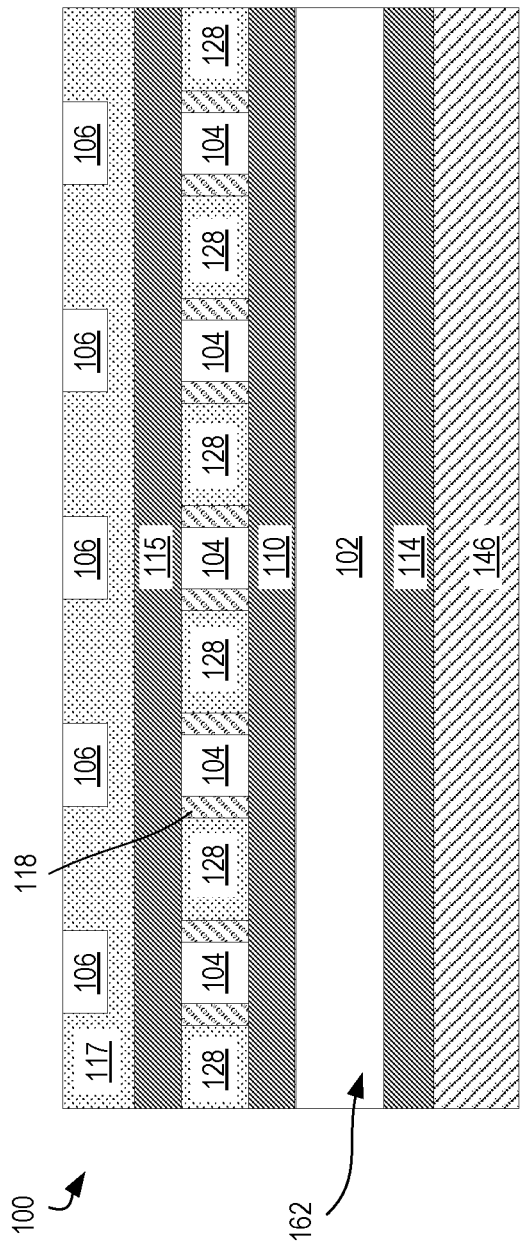
Figure 1C:
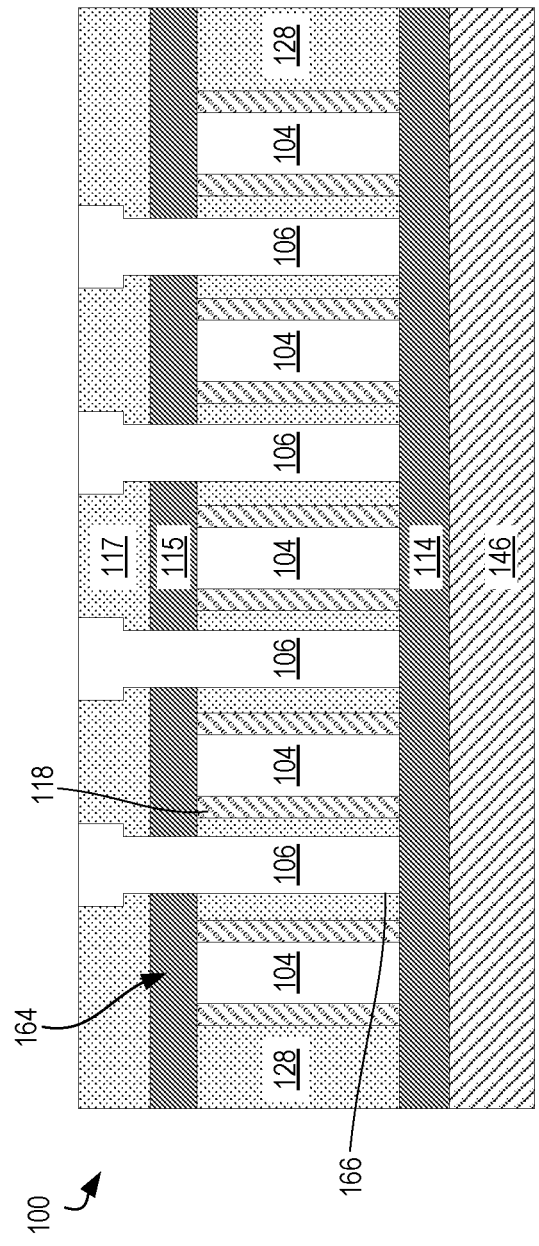
Figure 1F:
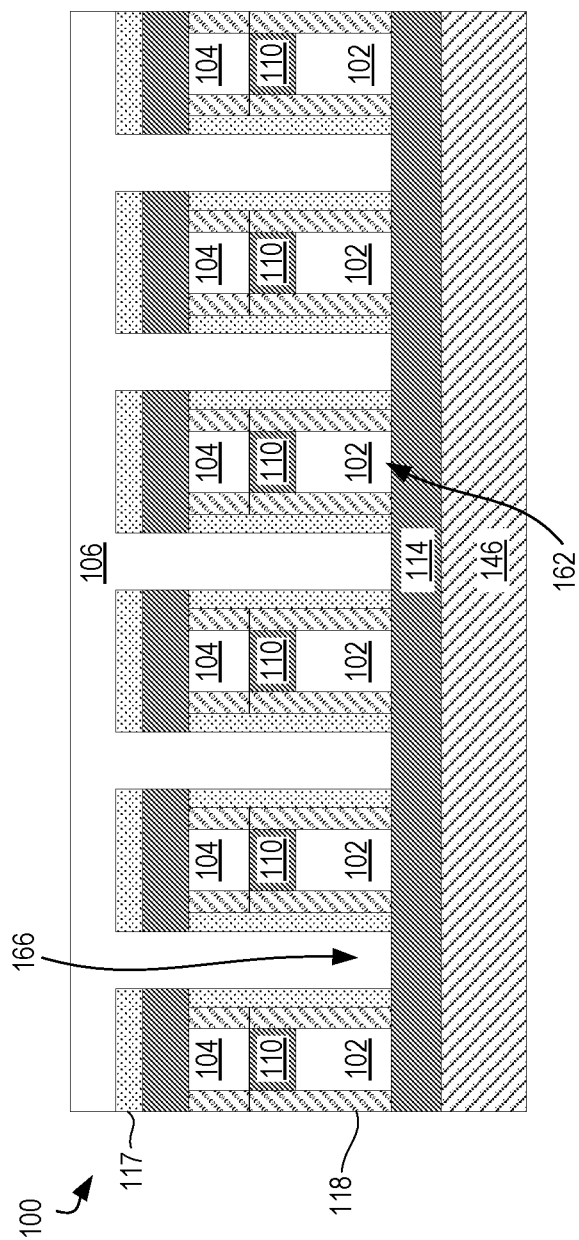

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Figure 2:
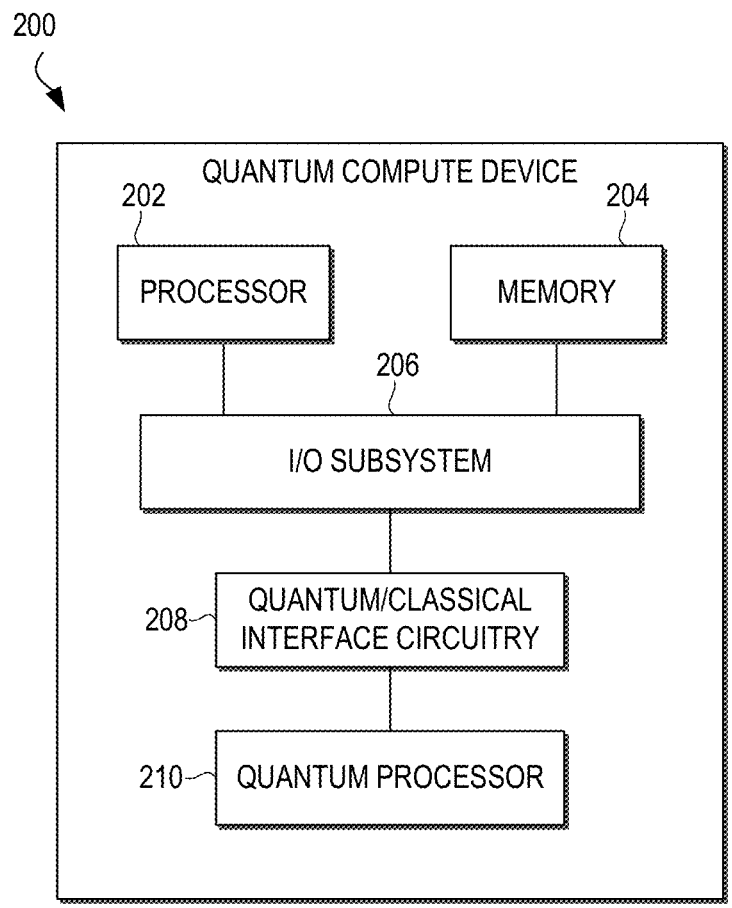
FIG. 2 is a simplified block diagram of at least one embodiment of a quantum compute device.

Referring now to FIG. 2, a simplified block diagram of a quantum compute device 200 is shown. In some embodiments, the quantum compute device 200 may include the quantum dot devices 100 described above in regard to FIGS. 1A-1F. The quantum compute device 200 may be embodied as or included in any type of compute device. For example, the quantum compute device 200 may include or otherwise be included in, without limitation, a server computer, an embedded computing system, a System-on-a-Chip (SoC), a multiprocessor system, a processor-based system, a consumer electronic device, a desktop computer, a laptop computer, a network device, a networked computer, a distributed computing system, and/or any other computing device. The illustrative quantum compute device 200 includes a processor 202, a memory 204, an input/output (I/O) subsystem 206, a quantum/classical interface circuitry 208, and a quantum processor 210. In some embodiments, one or more of the illustrative components of the quantum compute device 200 may be incorporated in, or otherwise form a portion of, another component. For example, the memory 204, or portions thereof, may be incorporated in the processor 202 in some embodiments. In some embodiments, the quantum compute device 200 may be embodied as the electrical device 1200 described below in regard to FIG. 12 or may include any suitable component of the electrical device 1200.

In some embodiments, the quantum compute device 200 may be located in a data center with other compute devices, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves), a micro data center, etc. In some embodiments, the quantum compute device 200 may receive jobs over a network (such as the Internet) to perform on the quantum processor 210. The quantum compute device 200 may perform the jobs on the quantum processor 210 and send the results back to the requesting device.

The processor 202 may be embodied as any type of processor capable of performing the functions described herein. For example, the processor 202 may be embodied as a single or multi-core processor(s), a single or multi-socket processor, a digital signal processor, a graphics processor, a neural network compute engine, an image processor, a microcontroller, or other processor or processing/controlling circuit. The processor 202 may include multiple processor cores. In some embodiments, the processor 202 supports quantum extensions to an existing ISA of the processor/core 202, allowing instructions that interface with the quantum/classical interface circuitry 208 and the quantum processor 210.

The memory 204 may be embodied as any type of volatile or non-volatile memory or data storage capable of performing the functions described herein. In operation, the memory 204 may store various data and software used during operation of the quantum compute device 200, such as operating systems, applications, programs, libraries, and drivers. The memory 204 is communicatively coupled to the processor 202 via the I/O subsystem 206, which may be embodied as circuitry and/or components to facilitate input/output operations with the processor 202, the memory 204, and other components of the quantum compute device 200. For example, the I/O subsystem 206 may be embodied as, or otherwise include, memory controller hubs, input/output control hubs, firmware devices, communication links (e.g., point-to-point links, bus links, wires, cables, light guides, printed circuit board traces, etc.) and/or other components and subsystems to facilitate the input/output operations. The I/O subsystem 206 may connect various internal and external components of the quantum compute device 200 to each other with use of any suitable connector, interconnect, bus, protocol, etc., such as an SoC fabric, PCIe®, USB2, USB3, USB4, NVMe®, Thunderbolt®, Compute Express Link (CXL), and/or the like. In some embodiments, the I/O subsystem 206 may form a portion of a system-on-a-chip (SoC) and be incorporated, along with the processor 202 and the memory 204 and other components of the quantum compute device 200 on a single integrated circuit chip.

The quantum/classical interface circuitry 208 is configured to interface with both classical components of the quantum compute device 200, such as the processor 202 and memory 204, as well as the quantum processor 210. The quantum/classical interface circuitry 208 may include a variety of analog or digital circuitry, such as analog-to-digital converters, digital-to-analog converters, high gain amplifiers, low noise amplifiers, cryogenic amplifiers, field-programmable gate arrays (FPGAs), classical processors, application-specific integrated circuits (ASICs), signal conditioning circuitry, etc. In some embodiments, some or all of the quantum/classical interface circuitry 208 may be inside of a refrigerator, such as a dilution refrigerator, a magnetic refrigerator, a helium-4 and/or helium-3 refrigerator, etc. Some or all of the components of the quantum/classical interface circuitry 208 may be at any suitable temperature, such as 10 millikelvin, 100 millikelvin, 4 Kelvin, 20 Kelvin, 77 Kelvin, room temperature or above, or anywhere in between.

The quantum processor 210 is configured to operate one or more qubits. The quantum processor 210 may include a quantum processor die, companion chip, and/or other suitable components of the system 200. The qubits may be any suitable type of qubit, such as a quantum dot spin qubit described above in regard to FIGS. 1A-1F. In other embodiments, the qubits may be, e.g., charge qubits, transmon qubits, microwave qubits, superconducting qubits, or any other suitable type of qubits. The quantum processor 210 may include any suitable number of physical or logical qubits, such as $1-10^6$. In the illustrative embodiment, some or all of the quantum processor 210 is in a refrigerator such as a dilution refrigerator. In particular, in the illustrative embodiment, the qubits are held at a temperature of about 20 millikelvin. In other embodiments, the qubits may be held at any suitable temperature, such as 1-100 millikelvin or higher, depending on the temperature sensitivity of the particular qubit in use.

The quantum processor 210 may be able to control the various qubits in various ways, such as by performing two-qubit gates, three-qubit gates, error correction operations, transferring a state from one type of qubit to another, measuring some, any, or all of the qubits, initializing some, any, or all of the qubits, etc.

The quantum compute device 200 may include additional components not shown in FIG. 2, such as one or more data storage devices, a network interface controller, one or more peripheral devices, etc.

Figure 3:
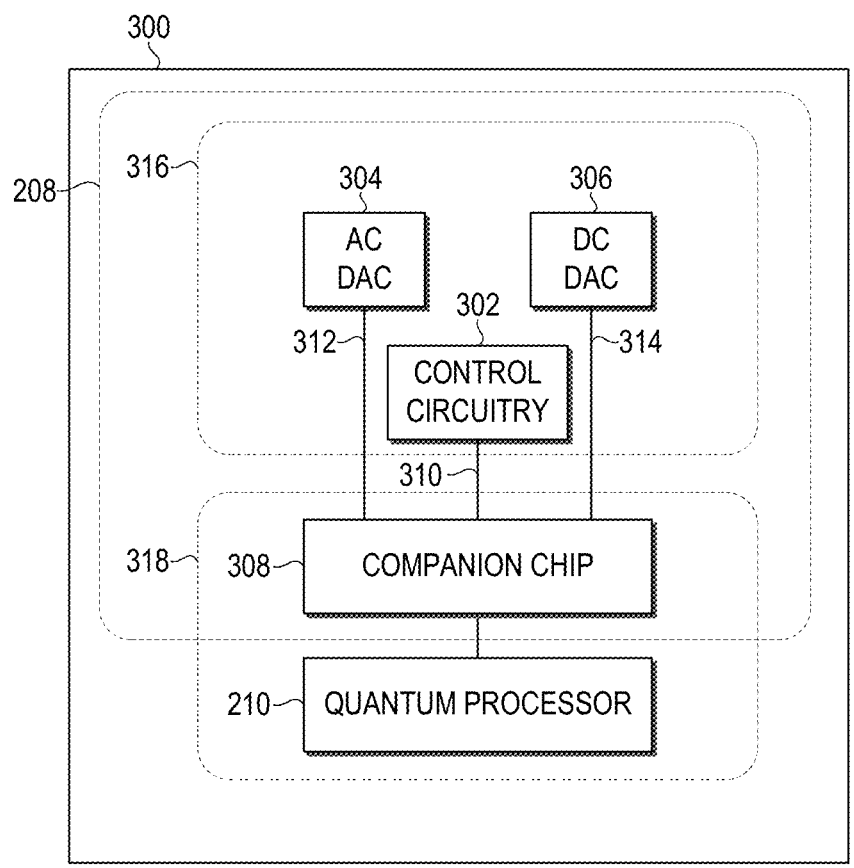
FIG. 3 is a simplified block diagram of at least one embodiment of a portion of the quantum compute device of FIG. 2.

Referring now to FIG. 3, in one embodiment, the quantum processor 210 and some or all of the quantum/classical interface circuitry 208 may be in a cryogenic refrigerator 300. The quantum/classical interface circuitry 208 includes control circuitry 302, an alternating current (AC) digital-to-analog converter (DAC) (relatively high-speed, low-resolution), a direct current (DC) DAC (relatively low-speed, high-resolution), and a companion chip 308.

In the illustrative embodiment, the control circuitry 302, AC DAC 304, and DC DAC 306 may be in a first stage 316 of the cryogenic refrigerator 300, and the companion chip 308 and the quantum processor 210 may be in a second stage 318 of the cryogenic refrigerator 300. In the illustrative embodiment, the first stage 316 is held at a temperature of about 4 Kelvin, and the second stage 318 is held at a temperature of about 20 millikelvin. In other embodiments, the first stage 316 may be held at, e.g., 1-77 Kelvin, and the second stage 318 may be held at, e.g., 10-100 millikelvin. In some embodiments, the various components of FIG. 3 may be in different stages than that shown in FIG. 3 and/or the refrigerator 300 may include additional stages, such as one or more stages at a higher or lower temperature than the first stage 316 and/or the second stage 318. The cryogenic refrigerator 300 may be any suitable refrigerator with active or passive cooling, such as a dilution refrigerator, a magnetic refrigerator, a helium-4 and/or helium-3 refrigerator, etc.

In use and as described in more detail below, the DC DAC 306 sends signals to the companion chip 308 that the companion chip 308 can use to establish a fixed offset voltage for one or more gates of the quantum processor 210. The AC DAC 304 sends time-varying signals to the companion chip 308 that the companion chip 308 can use to apply voltages to one or more gates of the quantum processor 210 to perform single- or multi-qubit operations. The control circuitry 302 controls what signals the DC DAC 306 and AC DAC 304 send to the companion chip 308, and the control circuitry 302 also signals to the companion chip 308 how to handle the signals from the DC DAC 306 and the AC DAC 304.

The control circuitry 302 may be connected to the companion chip 308 by one or more wires 310. The wires 310 may be embodied as one or more cables, buses, twisted wire pairs, etc. Similarly, the AC DAC 304 and the DC DAC 306 may be connected to the companion chip 308 by one or more wires 312 and one or more wires 314, respectively. The wires 312, 314 may be similar to the wires 310. In the illustrative embodiment, the wires 312 and wires 314 carry one signal from the AC DAC 304 and DC DAC 306, respectively, to the companion chip 308, and wires 310 carry signals that can be used to control multiplexers and other switches on the companion chip 308.

The control circuitry 302, the AC DAC 304, and/or the DC DAC 306 may be implemented in any suitable manner, such as a processor, an application-specific integrated circuit (ASIC), a field-programmable gate array (FPGA), etc. The control circuitry 302, the AC DAC 304, and/or the DC DAC 306 may include additional connections not shown in FIG. 3, such as connections to each other and/or to other components in the quantum compute device 200.

Figure 4:
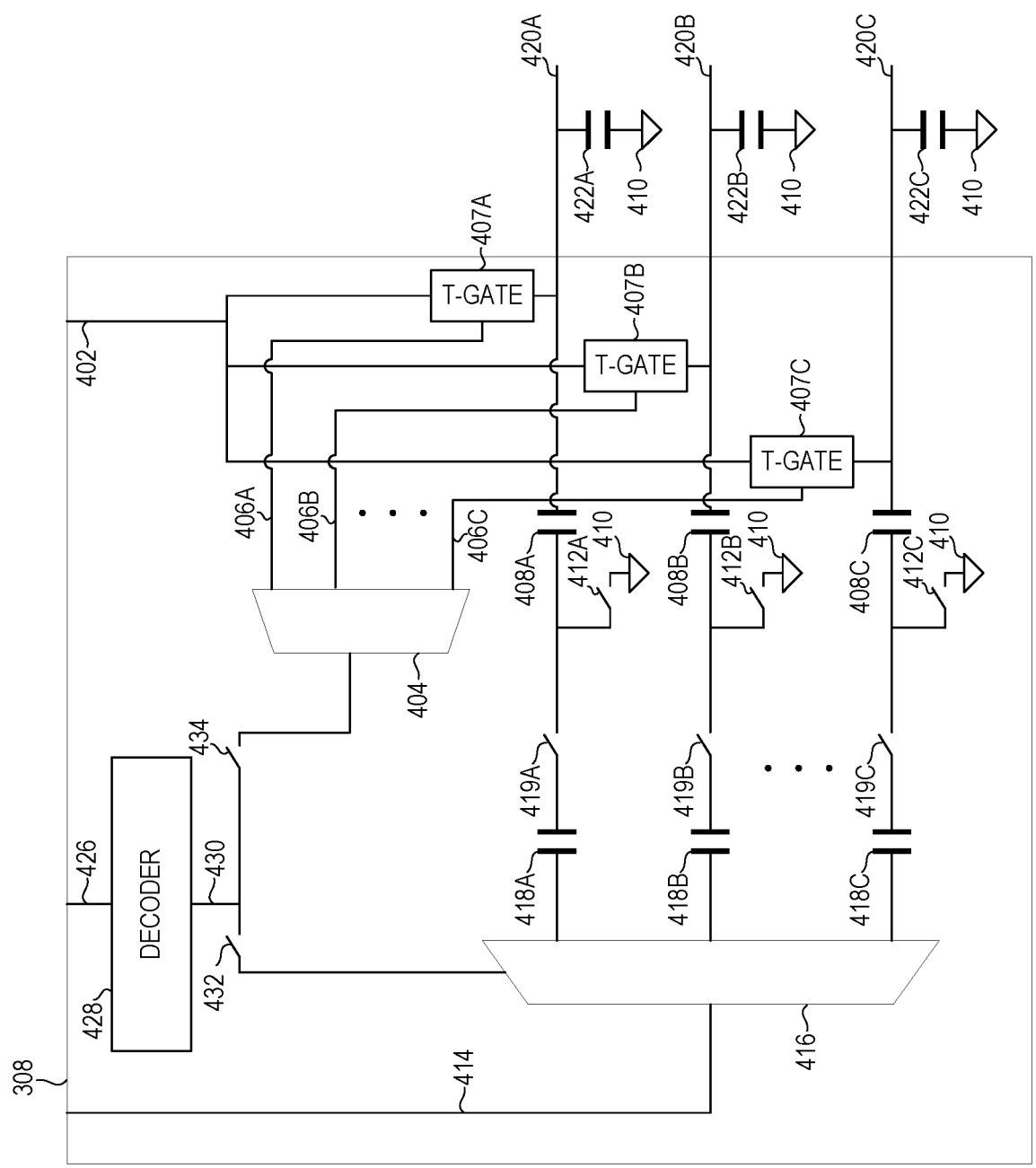
FIG. 4 is a simplified circuit diagram of one embodiment of a companion chip of the quantum compute device of FIG. 2.

Referring now to FIG. 4, in one embodiment, a simplified circuit diagram of a companion chip 308 is shown. In the illustrative embodiment, a trace 402 is connected to the DC DAC 306 through the one or more wires 314. One or more of the wires 314 may be connected to the trace 402 using any suitable technique, such as a connector, wire bonding, solder pad, solder bump, and/or the like.

The trace 402 is connected to one or more transmission gates 407, such as transmission gate 407A, transmission gate 407B, and transmission gate 407C. The transmission gate 407 may be referred to as a high-voltage transmission gate 407, as the transmission gate 407 can operate at voltages above the breakdown voltage of individual transistors of the transmission gate 407, as described in more detail in regard to FIG. 5. Each transmission gate 407 is connected to a capacitor 408 connected in series between another capacitor 418A and an output 420A that is coupled to a gate of the quantum processor 210.

Each transmission gate 407 is controlled by one or more traces in a bus 406 from an output of a multiplexer 404. In order to control the multiplexer 404, in the illustrative embodiment, some or all of the wires 310 from the control circuitry 302 are connected to a bus 426 on the companion chip 308. The bus 426 includes at least log 2(n) traces, where n is the number of outputs of the multiplexer 404 and, therefore, the number of outputs 420 of the companion chip 308 to be coupled to gates of the quantum processor 210. The signals on the bus 426 can indicate which output of the multiplexer 404 should be selected at a given time, and a decoder 428 decodes the signals on the bus 426 to generate a signal on one of n traces of a bus 430 connected to the multiplexer 404 to select a corresponding output of the multiplexer 404.

As described in more detail below, the multiplexer 404 provides various voltages to the transmission gates 407. The multiplexer 404 may receive the voltages to apply from the control circuitry 302, or the multiplexer 404 may generate the voltages, such as by using a level shifter. In some embodiments, the multiplexer 404 may include the transmission gate 407.

In use, one end of the capacitor 408A is connected to ground 410 by closing a switch 412A, and a DC voltage from the DC DAC 306 is used to charge the capacitor 408A. The transmission gate 407A is controlled to allow voltage to be transmitted through it, while other transmission gates 407B, 407C are controlled to not allow voltage to be transmitted through it. In the illustrative embodiment, charging the capacitor 408A also charges a parasitic capacitance represented by the capacitor 422A. Switches 412A, 412B, 412C may be any suitable switch, such as a transistor. In the illustrative embodiment, switches 412A, 412B, 412C (as well as other switches on the companion chip 308, such as switch 432 and switch 434) may be controlled by a signal from the control circuitry 302 (not shown in FIG. 4).

Each of the capacitors 408A, 408B, 408C are initialized to a voltage level based on a parameter of the corresponding gate of the quantum processor 210. Each capacitor 408 is initialized one at a time by selecting the capacitor 408 using the decoder 428 while the corresponding signal is generated on the DC DAC 306. During initialization of the capacitors 408A, 408B, 408C, switch 434 is closed and switch 432 is open. The DC DAC 306 may charge the capacitors 408A, 408B, 408C to any suitable voltage, such as anywhere from −5 to 5 volts.

In the illustrative embodiment, a trace 414 is connected to the AC DAC 304 through the one or more wires 312. One or more of the wires 312 may be connected to the trace 414 using any suitable technique, such as a connector, wire bonding, solder pad, solder bump, and/or the like.

The trace 414 is connected to a multiplexer 416. The multiplexer 416 has two or more outputs, such as to capacitors 418A, 418B, 418C, etc. Each capacitor 418A, 418B, 418C has one end connected to ground 410 and one end connected between the multiplexer 416 and the capacitor 408A, 408B, 408C.

In the illustrative embodiment, the companion chip 308 is a single chip, such as a silicon or other semiconductor chip, and the various traces and components shown in the circuit diagram are formed on the companion chip 308. In other embodiments, the companion chip 308 may be replaced with two or more chips or other components, such as components mounted on a printed circuit board, one or more wires, one or more bulk circuit elements, etc.

The companion chip 308 may have any suitable number of outputs 420 (as well as any suitable number of corresponding components, such as capacitors 418), such as 2-1,024 or more, depending on the number of qubits in the quantum processor 210. It should be appreciated that, in the illustrative embodiment, the number of connections between the companion chip 308 and the quantum processor 210 scale proportionally to the number of qubits on the quantum processor 210, while the number of connections between the control circuitry 302 and the companion chip 308 scales logarithmically with the number of qubits on the quantum processor 210.

Figure 5:
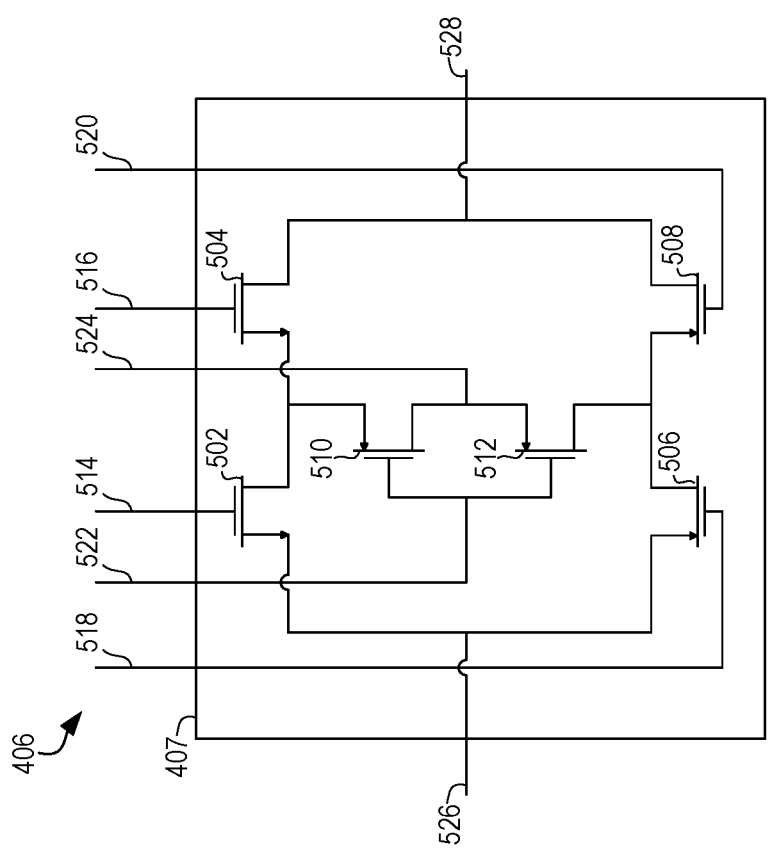
FIG. 5 is a simplified circuit diagram of one embodiment of a transmission gate of the companion chip of FIG. 4.

Referring now to FIG. 5, in one embodiment, the transmission gate 407 has an input 526 and an output 528. A first n-type metal-oxide-semiconductor (MOS) transistor 502 and a second n-MOS transistor 504 are between the input 526 and the output 528. It should be appreciated that current can flow in either direction through the transmission gate 407. As such, the designation of a terminal of the transistors 502, 504 or other transistors of the transmission gate 407 as a source or drain is arbitrary. In the interest of clarity, particular terminals of the transistors will be labeled as source or drain in the description below. As used herein, either the source or the drain of a transistor may be referred to as a source/drain region.

In the illustrative embodiment, the drain of the first n-MOS transistor 502 is connected to the input 526, the source of the first n-MOS transistor 502 is connected to the drain of the second n-MOS transistor 504, and the source of the second n-MOS transistor 504 is connected to the output 528. The transmission gate 407 also includes a first p-MOS transistor 506 and a second p-MOS transistor 508. In the illustrative embodiment, the source of the first p-MOS transistor 506 is connected to the input 526, the drain of the first p-MOS transistor 506 is connected to the source of the second p-MOS transistor 508, and the drain of the second p-MOS transistor 508 is connected to the output 528. The transmission gate 407 includes a first mid-point p-MOS transistor 510 and a second mid-point p-MOS transistor 512. The source of the mid-point transistor 510 is connected to the source of the first n-MOS transistor 502 and the drain of the second n-MOS transistor 504. The drain of the mid-point transistor 512 is connected to the drain of the first p-MOS transistor 506 and the source of the second p-MOS transistor 508. The gate of each transistor 502, 504, 506, 508, 510, 512 is connected to a trace 514, 516, 518, 520, 522, 524, respectively, which are connected to the corresponding bus 406. Another trace 524 is connected between the mid-point transistors 510, 512.

In the illustrative embodiment, each transistor 502, 504, 506, 508, 510, 512 has a breakdown voltage of, e.g., 0.5-5 volts. In the illustrative embodiment, the transistors 502, 504, 506, 508, 510, 512 are thick gate devices.

In use, the transmission gate 407 can be "on," allowing current or voltage to pass from the input 526 to the output 528, or "off," blocking current or voltage from passing from the input 526 to the output 528. In the illustrative embodiment, the voltages at the input 526 and/or output 528 may be above the breakdown voltage of the transistors 502, 504, 506, 508, 510, 512 and, in particular, the difference between the voltage at the input 526 and the output 528 may be greater than the breakdown voltage of the transistors 502, 504, 506, 508, 510, 512 when the transmission gate 407 is off. As such, the control circuitry 302, together with the multiplexer 404, manages the voltages across the various terminals of each transistor 502, 504, 506, 508, 510, 512 to ensure that the voltage across any terminals of a transistor 502, 504, 506, 508, 510, 512 does not exceed the breakdown voltage.

For example, in one embodiment, transistors 502, 504, 506, 508, 510, 512 can operate with two volts across their terminals but may be damaged if a breakdown voltage of, e.g., three or four volts is applied across their terminals. In such an embodiment, the voltage across the terminals of the transistors 502, 504, 506, 508, 510, 512 can be kept at two volts or below by applying the voltages shown in Tables 1 and 2 to the gates of the transistors 502, 504, 506, 508. Table 1 shows the voltages applied to the transistors 502, 504, 506, 508 when the transmission gate 407 is on. When the transmission gate 407 is on, the voltage applied to the gates of transistors 510, 512 is two volts, preventing the voltage on trace 524 from reaching the other transistors 502, 504, 506, 508. The voltage on the trace 524 is also two volts, so the voltage across the terminals of the transistors 510, 512 is less than two for a range of input voltages of 0-4 volts.

TABLE 1

| Input and output voltages | Transistor gate voltages |
|---|---|
| $0 \leq V_{IN} \leq 2$ volts<br>$0 \leq V_{OUT} \leq 2$ volts | $V_{502} = 2$<br>$V_{504} = 2$<br>$V_{506} = 0$<br>$V_{508} = 0$ |
| $2 \leq V_{IN} \leq 4$ volts<br>$2 \leq V_{OUT} \leq 4$ volts | $V_{502} = 4$<br>$V_{504} = 4$<br>$V_{506} = 2$<br>$V_{508} = 2$ |

TABLE 2

| Input and output voltages | Transistor gate voltages |
|---|---|
| $0 \leq V_{IN} \leq 2$ volts<br>$0 \leq V_{OUT} \leq 2$ volts | $V_{502} = 0$<br>$V_{504} = 0$<br>$V_{506} = 2$<br>$V_{508} = 2$ |
| $2 \leq V_{IN} \leq 4$ volts<br>$0 \leq V_{OUT} \leq 2$ volts | $V_{502} = 2$<br>$V_{504} = 0$<br>$V_{506} = 4$<br>$V_{508} = 2$ |
| $0 \leq V_{IN} \leq 2$ volts<br>$2 \leq V_{OUT} \leq 4$ volts | $V_{502} = 0$<br>$V_{504} = 2$<br>$V_{506} = 2$<br>$V_{508} = 4$ |
| $2 \leq V_{IN} \leq 4$ volts<br>$2 \leq V_{OUT} \leq 4$ volts | $V_{502} = 2$<br>$V_{504} = 2$<br>$V_{506} = 4$<br>$V_{508} = 4$ |

When the transmission gate 407 is on, the voltage on the output 528 will be the same as the voltage on the input 526. When the input voltage is between zero and two volts, the voltage applied to the gates of the n-MOS transistors 502, 504 is two volts and the voltage applied to the gates of the p-MOS transistors 506, 508 is zero volts. When the input voltage is between two and four volts, the voltage applied to the gates of the transistors 502, 504, 506, 508 is increased by two volts.

When the transmission gate 407 is off, the voltage applied to the gates of transistors 510, 512 is zero volts, allowing the voltage on trace 524 to carry through to the source of the n-MOS transistor 502 and drain of the n-MOS transistor 504, as well as to the drain of the p-MOS transistor 506 and the source of the p-MOS transistor 508. The voltage on trace 524 keeps the midpoint of the transmission gate 407 at two volts, regardless of the voltage on the input 526 or output 528.

When the transmission gate 407 is off, the voltage on the input 526 can be different from the voltage on the output 528. As the voltage on trace 524 keeps the midpoint of the transmission gate 407 at two volts, the voltage applied to the transistors 502, 506 connected to the input 526 depends on the voltage at the input 526, and the voltage applied to the transistors 504, 508 connected to the output 528 depends on the voltage at the output 528. When the input voltage is between zero and two volts, the voltage applied to the gate of the n-MOS transistor 502 is zero volts and the voltage applied to the gate of the p-MOS transistor 506 is two volts. When the input voltage is between two and four volts, the voltage applied to the gate of the n-MOS transistor 502 is two volts and the voltage applied to the gate of the p-MOS transistor 506 is four volts. When the output voltage is between zero and two volts, the voltage applied to the gate of the n-MOS transistor 504 is zero volts and the voltage applied to the gate of the p-MOS transistor 508 is two volts. When the output voltage is between two and four volts, the voltage applied to the gate of the n-MOS transistor 504 is two volts and the voltage applied to the gate of the p-MOS transistor 508 is four volts.

It should be appreciated that the voltages shown in Tables 1 and 2 are merely for one possible embodiment, and that other voltages may be used in other embodiments. For example, all of the voltages in Tables 1 and 2 may be scaled up or down depending on the breakdown voltage of the transistors 502, 504, 506, 508, 510, 512. As another example, the voltages may be applied to the gates of the transistors 502, 504, 506, 508 with a more fine-grained approach, changing the applied voltage a smaller amount in response to a smaller shift in the input or output voltage. For example, in some embodiments, the control circuitry 302 can ramp the voltage up or down or otherwise follow a sequence of voltages to reach a final voltage in order to prevent adverse effects and prevent exceeding breakdown voltage across the terminals of any transistor 502, 504, 506, 508, 510, 512.

Figure 6:
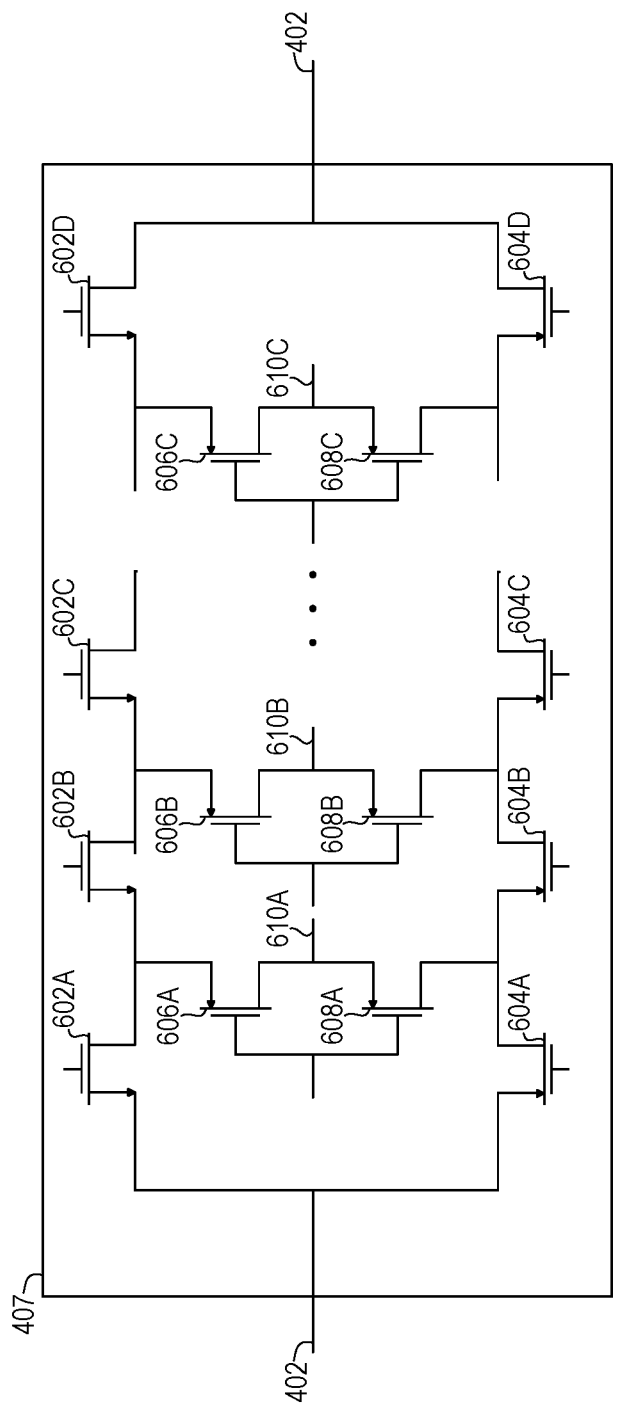
FIG. 6 is a simplified circuit diagram of one embodiment of a transmission gate of the companion chip of FIG. 4.

Referring now to FIG. 6, in one embodiment, a transmission gate 407 may be able to transmit voltage that is more than twice the breakdown voltage of the transistors of the transmission gate 407. To do so, the transmission gate 407 may include several n-MOS transistors 602, several p-MOS transistors 604, several midpoint transistors 606 connecting a voltage on a trace 610 between two n-MOS transistors 602, and several midpoint transistors 608 connecting a voltage on the trace 610 between two p-MOS transistors 604. The connections to the gates and the traces 610 are not shown in the interest of clarity.

In use, the input and output voltage can be anywhere from zero volts to n times an operating voltage of the transistors 602, 604, 606, 608, where n is the number of stages of n-MOS transistors 602 and p-MOS transistors 604. For example, in one embodiment, the transmission gate 407 may include four stages, with for n-MOS transistors 602 and four p-MOS transistors 604. Such a transmission gate 407 would allow for input and/or output voltages to be anywhere from zero to four times an operating voltage of the transistors 602, 604, 606, 608. The voltages suppled to gates of the transistors 602, 604, 606, 608 and the traces 610 can be controlled to ensure that no transistors 602, 604, 606, 608 has a voltage across its terminals that exceed the breakdown voltage, in a similar manner as for the transmission gate 407 described above in regard to FIG. 5.

It should be appreciated that, in the illustrative embodiment, the companion chip 308 does not have any components such as amplifiers that draw DC power. Rather, the companion chip 308 provides voltages by switching capacitors.

The diagrams shown in FIGS. 3-6 are merely one possible embodiment of the control circuitry 302 and companion chip 308. In other embodiments, the various components may be arranged differently and/or may include more or fewer components. For example, in one embodiment, there may be two capacitors 418 that can be connected to the capacitor 408 one at a time by a switch. Such an approach would allow the AC DAC 304 to charge one capacitor 418 while the other is applying a voltage to the output 420, allowing continuous pulsing on the outputs 420.

Figure 7:
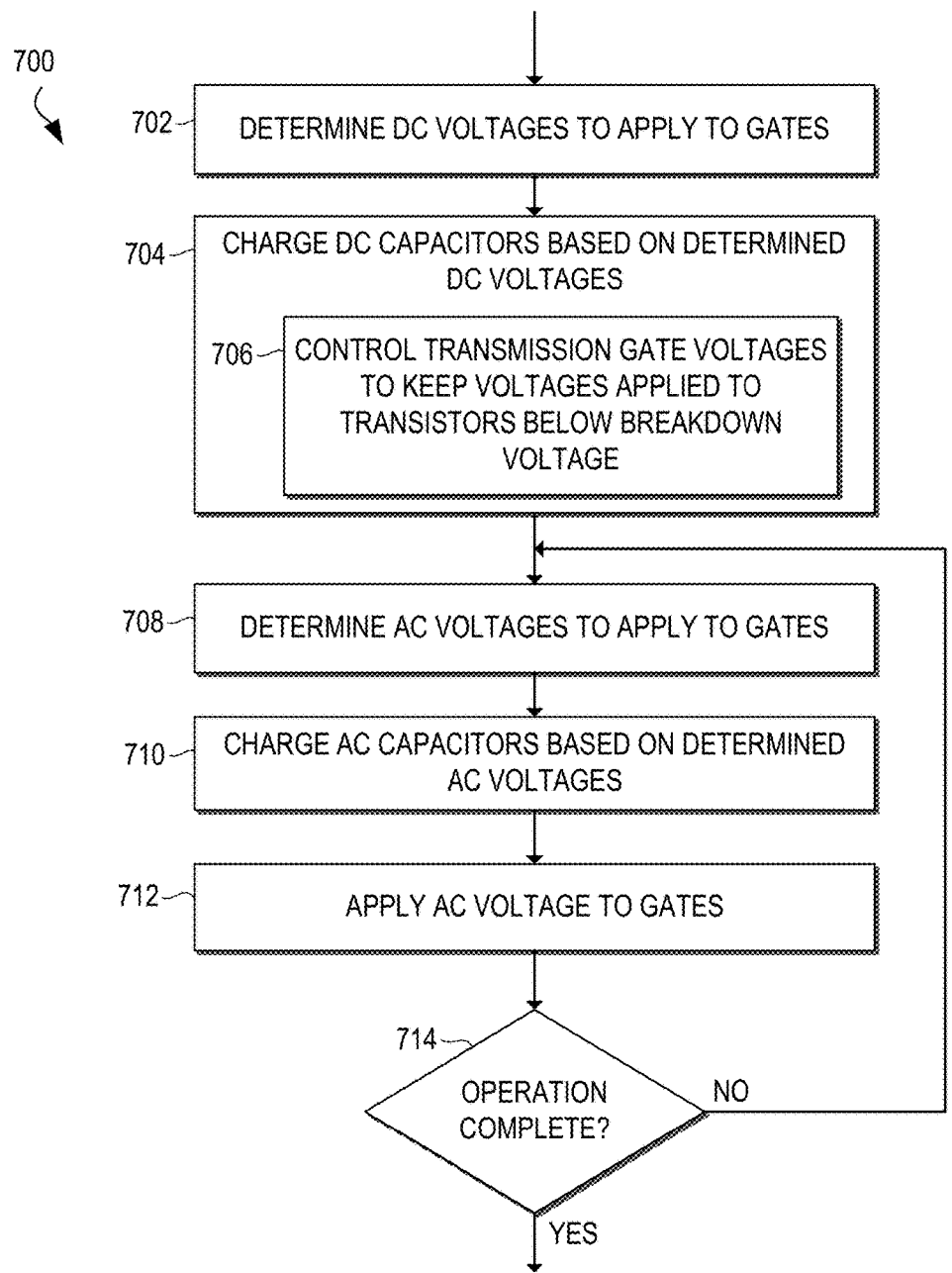
FIG. 7 is a simplified flow diagram of at least one embodiment of a method for operating the companion chip of FIG. 4

Referring now to FIG. 7, in one embodiment, a flowchart for a method 700 for operating the companion chip 308 is shown. The method 700 begins in block 702, in which the control circuitry 302 determines the DC bias voltages to be applied to each gate of the quantum processor 210. In block 704, the control circuitry 302 charges each capacitor 408 based on the determined DC bias voltage for the corresponding gate. In block 706, the control circuitry 302 controls the voltages suppled to the transmission gate 407, such as traces 514, 516, 18, 520, 522, and 524.

In block 708, the control circuitry 302 determines AC voltages to apply to each gate. The control circuitry 302 may determine the voltage to apply based on a desired operation to be performed on the corresponding gate. In block 710, the control circuitry 302 charges each capacitor 418 based on the determined AC voltage for the corresponding gate. In block 712, the control circuitry 302 applies the determined AC voltage to each of the gates.

In block 714, if the operation is not complete, then method 700 loops back to block 706 to determine additional AC voltages to be applied to each gate. If the operation is complete, the method 700 is complete. The control circuitry 302 may then read an output of the quantum processor 210, prepare the companion chip 308 for another operation, etc.

Figure 8:
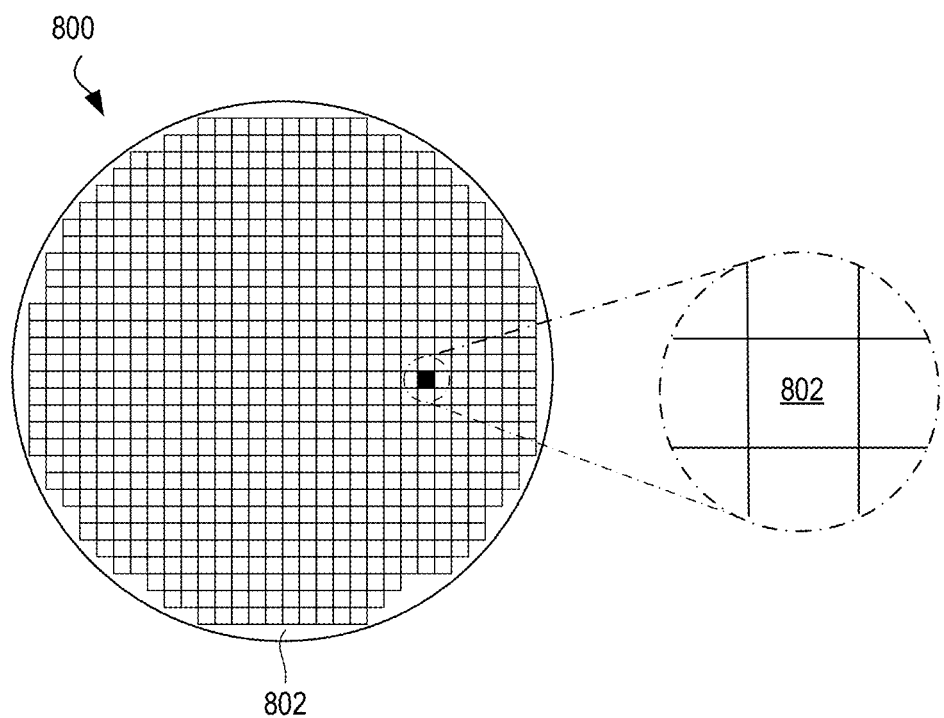
FIG. 8 is a top view of a wafer and dies, in accordance with any of the embodiments disclosed herein.

FIG. 8 is a top view of a wafer 800 and dies 802 that may be included in the system 200 disclosed herein (e.g., as a suitable quantum processor die or companion chip). The wafer 800 may be composed of semiconductor material and may include one or more dies 802 having integrated circuit structures formed on a surface of the wafer 800. The individual dies 802 may be a repeating unit of an integrated circuit product that includes any suitable integrated circuit. After the fabrication of the semiconductor product is complete, the wafer 800 may undergo a singulation process in which the dies 802 are separated from one another to provide discrete "chips" of the integrated circuit product. The die 802 may be any of the dies 204 disclosed herein. The die 802 may include one or more transistors (e.g., some of the transistors 940 of FIG. 9, discussed below), supporting circuitry to route electrical signals to the transistors, passive components (e.g., signal traces, resistors, capacitors, or inductors), and/or any other integrated circuit components. In some embodiments, the wafer 800 or the die 802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 802. For example, a memory array formed by multiple memory devices may be formed on a same die 802 as a processor unit (e.g., the processor unit 1202 of FIG. 12) or other logic that is configured to store information in the memory devices or execute instructions stored in the memory array. Various ones of the systems 200 disclosed herein may be manufactured using a die-to-wafer assembly technique in which some dies are attached to a wafer 800 that include others of the dies, and the wafer 800 is subsequently singulated.

Figure 9:
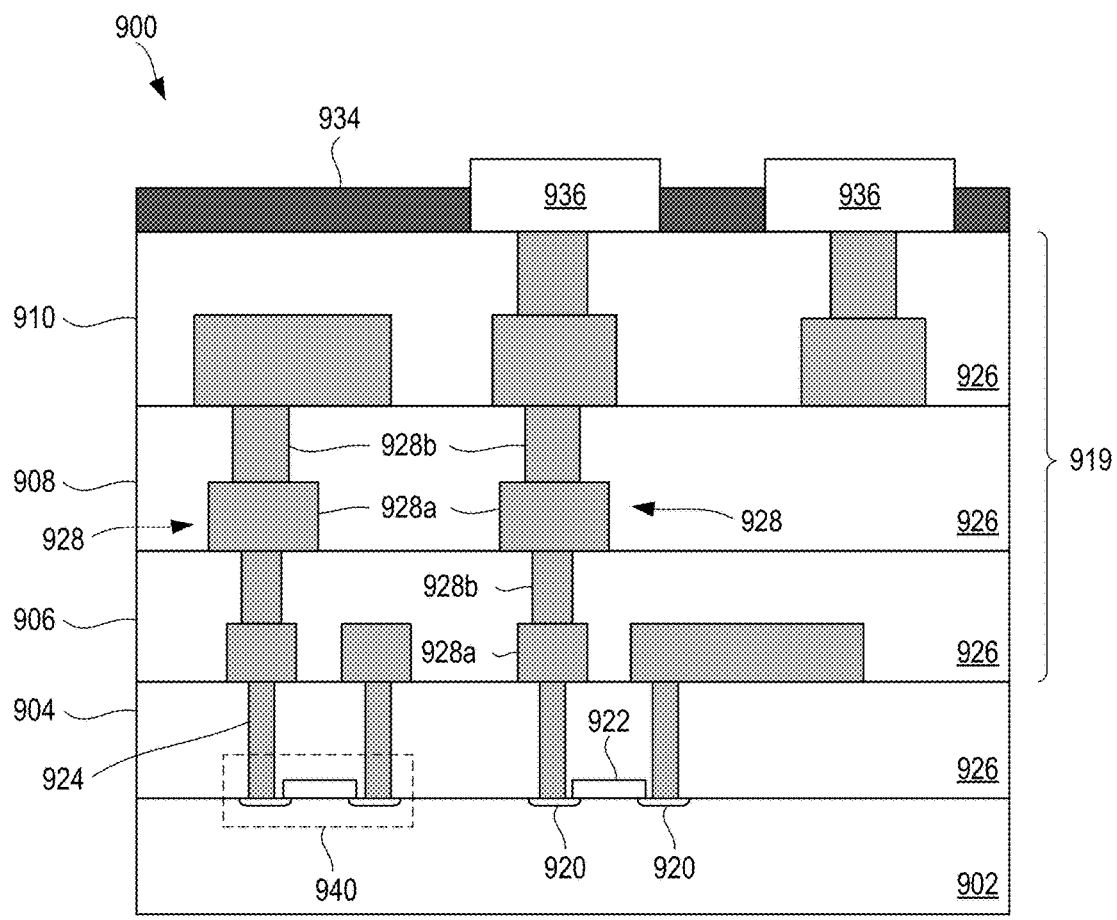
FIG. 9 is a cross-sectional side view of an integrated circuit, in accordance with any of the embodiments disclosed herein.

FIG. 9 is a cross-sectional side view of an integrated circuit device 900 that may be included in any of the systems 200 disclosed herein. One or more of the integrated circuit devices 900 may be included in one or more dies 802 (FIG. 8). The integrated circuit device 900 may be formed on a die substrate 902 (e.g., the wafer 800 of FIG. 8) and may be included in a die (e.g., the die 802 of FIG. 8). The die substrate 902 may be a semiconductor substrate composed of semiconductor material systems including, for example, n-type or p-type materials systems (or a combination of both). The die substrate 902 may include, for example, a crystalline substrate formed using a bulk silicon or a silicon-on-insulator (SOI) substructure. In some embodiments, the die substrate 902 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 902. Although a few examples of materials from which the die substrate 902 may be formed are described here, any material that may serve as a foundation for an integrated circuit device 900 may be used. The die substrate 902 may be part of a singulated die (e.g., the dies 802 of FIG. 8) or a wafer (e.g., the wafer 800 of FIG. 8).

The integrated circuit device 900 may include one or more device layers 904 disposed on the die substrate 902. The device layer 904 may include features of one or more transistors 940 (e.g., metal oxide semiconductor field-effect transistors (MOSFETs)) formed on the die substrate 902. The transistors 940 may include, for example, one or more source and/or drain (S/D) regions 920, a gate 922 to control current flow between the S/D regions 920, and one or more S/D contacts 924 to route electrical signals to/from the S/D regions 920. The transistors 940 may include additional features not depicted for the sake of clarity, such as device isolation regions, gate contacts, and the like. The transistors 940 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 10A-10D are simplified perspective views of example planar, FinFET, gate-all-around, and stacked gate-all-around transistors. The transistors illustrated in FIGS. 10A-10D are formed on a substrate 1016 having a surface 1008. Isolation regions 1014 separate the source and drain regions of the transistors from other transistors and from a bulk region 1018 of the substrate 1016.

Figure 10B:
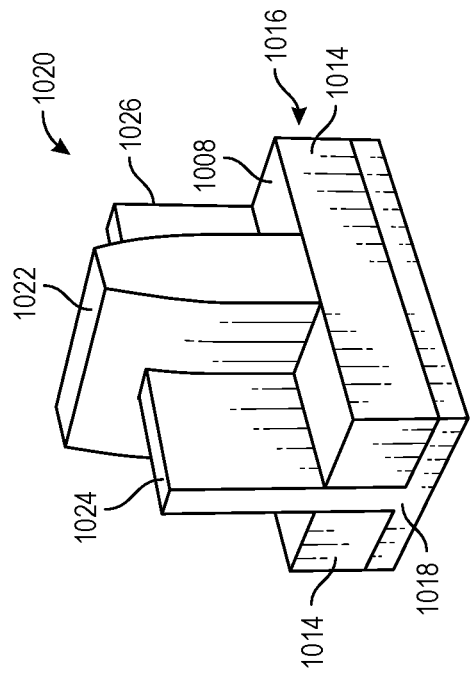
FIGS. 10A-10D are perspective views of example planar, gate-all-around, and stacked gate-all-around transistors.
Figure 10D:
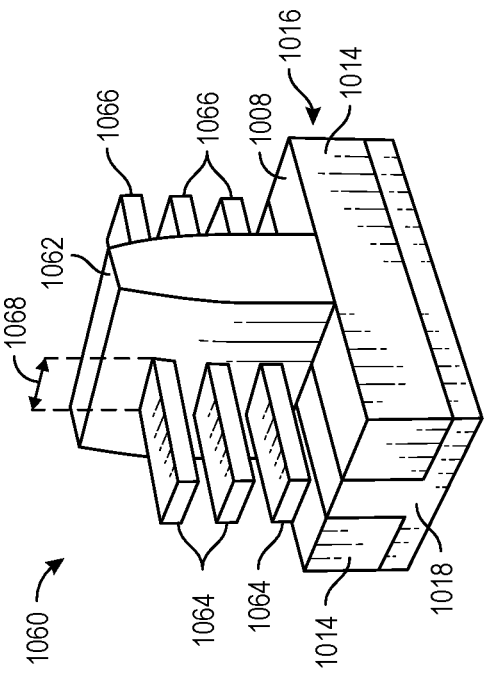
Figure 10A:
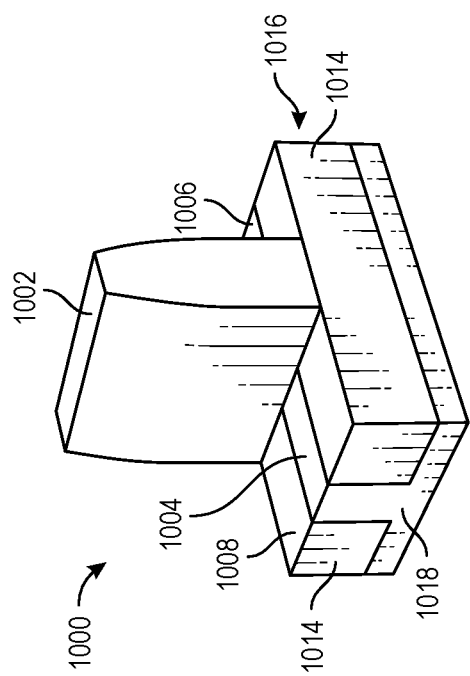

FIG. 10A is a perspective view of an example planar transistor 1000 comprising a gate 1002 that controls current flow between a source region 1004 and a drain region 1006. The transistor 1000 is planar in that the source region 1004 and the drain region 1006 are planar with respect to the substrate surface 1008.

FIG. 10B is a perspective view of an example FinFET transistor 1020 comprising a gate 1022 that controls current flow between a source region 1024 and a drain region 1026. The transistor 1020 is non-planar in that the source region 1024 and the drain region 1026 comprise "fins" that extend upwards from the substrate surface 1028. As the gate 1022 encompasses three sides of the semiconductor fin that extends from the source region 1024 to the drain region 1026, the transistor 1020 can be considered a tri-gate transistor. FIG. 10B illustrates one S/D fin extending through the gate 1022, but multiple S/D fins can extend through the gate of a FinFET transistor.

Figure 10C:
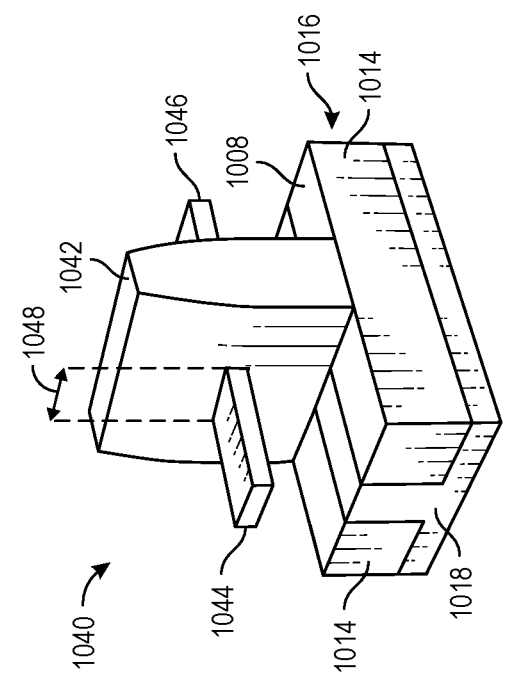

FIG. 10C is a perspective view of a gate-all-around (GAA) transistor 1040 comprising a gate 1042 that controls current flow between a source region 1044 and a drain region 1046. The transistor 1040 is non-planar in that the source region 1044 and the drain region 1046 are elevated from the substrate surface 1028.

FIG. 10D is a perspective view of a GAA transistor 1060 comprising a gate 1062 that controls current flow between multiple elevated source regions 1064 and multiple elevated drain regions 1066. The transistor 1060 is a stacked GAA transistor as the gate controls the flow of current between multiple elevated S/D regions stacked on top of each other. The transistors 1040 and 1060 are considered gate-all-around transistors as the gates encompass all sides of the semiconductor portions that extends from the source regions to the drain regions. The transistors 1040 and 1060 can alternatively be referred to as nanowire, nanosheet, or nanoribbon transistors depending on the width (e.g., widths 1048 and 1068 of transistors 1040 and 1060, respectively) of the semiconductor portions extending through the gate.

Returning to FIG. 9, a transistor 940 may include a gate 922 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 940 along the source-channel-drain direction, the gate electrode may consist of a U-shaped structure that includes a bottom portion substantially parallel to the surface of the die substrate 902 and two sidewall portions that are substantially perpendicular to the top surface of the die substrate 902. In other embodiments, at least one of the metal layers that form the gate electrode may simply be a planar layer that is substantially parallel to the top surface of the die substrate 902 and does not include sidewall portions substantially perpendicular to the top surface of the die substrate 902. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 920 may be formed within the die substrate 902 adjacent to the gate 922 of individual transistors 940. The S/D regions 920 may be formed using an implantation/diffusion process or an etching/deposition process, for example. In the former process, dopants such as boron, aluminum, antimony, phosphorous, or arsenic may be ion-implanted into the die substrate 902 to form the S/D regions 920. An annealing process that activates the dopants and causes them to diffuse farther into the die substrate 902 may follow the ion-implantation process. In the latter process, the die substrate 902 may first be etched to form recesses at the locations of the S/D regions 920. An epitaxial deposition process may then be carried out to fill the recesses with material that is used to fabricate the S/D regions 920. In some implementations, the S/D regions 920 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 920 may be formed using one or more alternate semiconductor materials such as germanium or a group III-V material or alloy. In further embodiments, one or more layers of metal and/or metal alloys may be used to form the S/D regions 920.

Electrical signals, such as power and/or input/output (I/O) signals, may be routed to and/or from the devices (e.g., transistors 940) of the device layer 904 through one or more interconnect layers disposed on the device layer 904 (illustrated in FIG. 9 as interconnect layers 906-910). For example, electrically conductive features of the device layer 904 (e.g., the gate 922 and the S/D contacts 924) may be electrically coupled with the interconnect structures 928 of the interconnect layers 906-910. The one or more interconnect layers 906-910 may form a metallization stack (also referred to as an "ILD stack") 919 of the integrated circuit device 900.

The interconnect structures 928 may be arranged within the interconnect layers 906-910 to route electrical signals according to a wide variety of designs; in particular, the arrangement is not limited to the particular configuration of interconnect structures 928 depicted in FIG. 9. Although a particular number of interconnect layers 906-910 is depicted in FIG. 9, embodiments of the present disclosure include integrated circuit devices having more or fewer interconnect layers than depicted.

In some embodiments, the interconnect structures 928 may include lines 928a and/or vias 928b filled with an electrically conductive or superconductive material such as a metal. The lines 928a may be arranged to route electrical signals in a direction of a plane that is substantially parallel with a surface of the die substrate 902 upon which the device layer 904 is formed. For example, the lines 928a may route electrical signals in a direction in and out of the page and/or in a direction across the page. The vias 928b may be arranged to route electrical signals in a direction of a plane that is substantially perpendicular to the surface of the die substrate 902 upon which the device layer 904 is formed. In some embodiments, the vias 928b may electrically couple lines 928a of different interconnect layers 906-910 together.

The interconnect layers 906-910 may include a dielectric material 926 disposed between the interconnect structures 928, as shown in FIG. 9. In some embodiments, dielectric material 926 disposed between the interconnect structures 928 in different ones of the interconnect layers 906-910 may have different compositions; in other embodiments, the composition of the dielectric material 926 between different interconnect layers 906-910 may be the same. The device layer 904 may include a dielectric material 926 disposed between the transistors 940 and a bottom layer of the metallization stack as well. The dielectric material 926 included in the device layer 904 may have a different composition than the dielectric material 926 included in the interconnect layers 906-910; in other embodiments, the composition of the dielectric material 926 in the device layer 904 may be the same as a dielectric material 926 included in any one of the interconnect layers 906-910.

A first interconnect layer 906 (referred to as Metal 1 or "M1") may be formed directly on the device layer 904. In some embodiments, the first interconnect layer 906 may include lines 928a and/or vias 928b, as shown. The lines 928a of the first interconnect layer 906 may be coupled with contacts (e.g., the S/D contacts 924) of the device layer 904. The vias 928b of the first interconnect layer 906 may be coupled with the lines 928a of a second interconnect layer 908.

The second interconnect layer 908 (referred to as Metal 2 or "M2") may be formed directly on the first interconnect layer 906. In some embodiments, the second interconnect layer 908 may include via 928b to couple the lines 928 of the second interconnect layer 908 with the lines 928a of a third interconnect layer 910. Although the lines 928a and the vias 928b are structurally delineated with a line within individual interconnect layers for the sake of clarity, the lines 928a and the vias 928b may be structurally and/or materially contiguous (e.g., simultaneously filled during a dual-damascene process) in some embodiments.

The third interconnect layer 910 (referred to as Metal 3 or "M3") (and additional interconnect layers, as desired) may be formed in succession on the second interconnect layer 908 according to similar techniques and configurations described in connection with the second interconnect layer 908 or the first interconnect layer 906. In some embodiments, the interconnect layers that are "higher up" in the metallization stack 919 in the integrated circuit device 900 (i.e., farther away from the device layer 904) may be thicker that the interconnect layers that are lower in the metallization stack 919, with lines 928a and vias 928b in the higher interconnect layers being thicker than those in the lower interconnect layers.

The integrated circuit device 900 may include a solder resist material 934 (e.g., polyimide or similar material) and one or more conductive contacts 936 formed on the interconnect layers 906-910. In FIG. 9, the conductive contacts 936 are illustrated as taking the form of bond pads. The conductive contacts 936 may be electrically coupled with the interconnect structures 928 and configured to route the electrical signals of the transistor(s) 940 to external devices. For example, solder bonds may be formed on the one or more conductive contacts 936 to mechanically and/or electrically couple an integrated circuit die including the integrated circuit device 900 with another component (e.g., a printed circuit board). The integrated circuit device 900 may include additional or alternate structures to route the electrical signals from the interconnect layers 906-910; for example, the conductive contacts 936 may include other analogous features (e.g., posts) that route the electrical signals to external components.

In some embodiments in which the integrated circuit device 900 is a double-sided die, the integrated circuit device 900 may include another metallization stack (not shown) on the opposite side of the device layer(s) 904. This metallization stack may include multiple interconnect layers as discussed above with reference to the interconnect layers 906-910, to provide conductive pathways (e.g., including conductive lines and vias) between the device layer(s) 904 and additional conductive contacts (not shown) on the opposite side of the integrated circuit device 900 from the conductive contacts 936.

In other embodiments in which the integrated circuit device 900 is a double-sided die, the integrated circuit device 900 may include one or more through silicon vias (TSVs) through the die substrate 902; these TSVs may make contact with the device layer(s) 904, and may provide conductive pathways between the device layer(s) 904 and additional conductive contacts (not shown) on the opposite side of the integrated circuit device 900 from the conductive contacts 936. In some embodiments, TSVs extending through the substrate can be used for routing power and ground signals from conductive contacts on the opposite side of the integrated circuit device 900 from the conductive contacts 936 to the transistors 940 and any other components integrated into the die 900, and the metallization stack 919 can be used to route I/O signals from the conductive contacts 936 to transistors 940 and any other components integrated into the die 900.

Multiple integrated circuit devices 900 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 11:
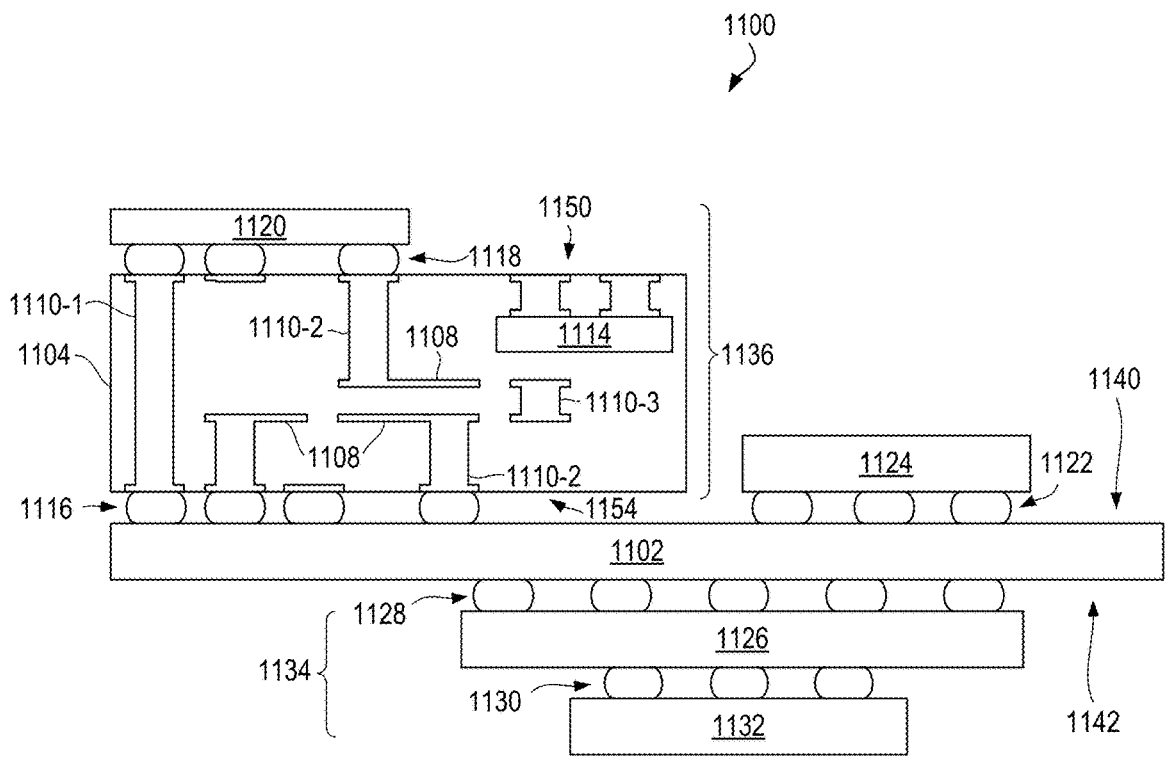
FIG. 11 is a cross-sectional side view of an integrated circuit device assembly, in accordance with any of the embodiments disclosed herein.

FIG. 11 is a cross-sectional side view of an integrated circuit device assembly 1100 that may include any of the systems 200 disclosed herein. In some embodiments, the integrated circuit device assembly 1100 may be a quantum processor 210. The integrated circuit device assembly 1100 includes a number of components disposed on a circuit board 1102 (which may be a motherboard, system board, mainboard, etc.). The integrated circuit device assembly 1100 includes components disposed on a first face 1140 of the circuit board 1102 and an opposing second face 1142 of the circuit board 1102; generally, components may be disposed on one or both faces 1140 and 1142. Any of the integrated circuit components discussed below with reference to the integrated circuit device assembly 1100 may take the form of any suitable ones of the embodiments of the systems 200 disclosed herein.

In some embodiments, the circuit board 1102 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1102. In other embodiments, the circuit board 1102 may be a non-PCB substrate. The integrated circuit device assembly 1100 illustrated in FIG. 11 includes a package-on-interposer structure 1136 coupled to the first face 1140 of the circuit board 1102 by coupling components 1116. The coupling components 1116 may electrically and mechanically couple the package-on-interposer structure 1136 to the circuit board 1102, and may include solder balls (as shown in FIG. 11), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1136 may include an integrated circuit component 1120 coupled to an interposer 1104 by coupling components 1118. The coupling components 1118 may take any suitable form for the application, such as the forms discussed above with reference to the coupling components 1116. Although a single integrated circuit component 1120 is shown in FIG. 11, multiple integrated circuit components may be coupled to the interposer 1104; indeed, additional interposers may be coupled to the interposer 1104. The interposer 1104 may provide an intervening substrate used to bridge the circuit board 1102 and the integrated circuit component 1120.

The integrated circuit component 1120 may be a packaged or unpacked integrated circuit product that includes one or more integrated circuit dies (e.g., the die 802 of FIG. 8, the integrated circuit device 900 of FIG. 9) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1120, a single monolithic integrated circuit die comprises solder bumps attached to contacts on the die. The solder bumps allow the die to be directly attached to the interposer 1104. The integrated circuit component 1120 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1120 can comprise one or more additional active or passive devices such as capacitors, decoupling capacitors, resistors, inductors, fitses, diodes, transformers, sensors, electrostatic discharge (ESD) devices, and memory devices.

In embodiments where the integrated circuit component 1120 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1120 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1104 may spread connections to a wider pitch or reroute a connection to a different connection. For example, the interposer 1104 may couple the integrated circuit component 1120 to a set of ball grid array (BGA) conductive contacts of the coupling components 1116 for coupling to the circuit board 1102. In the embodiment illustrated in FIG. 11, the integrated circuit component 1120 and the circuit board 1102 are attached to opposing sides of the interposer 1104; in other embodiments, the integrated circuit component 1120 and the circuit board 1102 may be attached to a same side of the interposer 1104. In some embodiments, three or more components may be interconnected by way of the interposer 1104.

In some embodiments, the interposer 1104 may be formed as a PCB, including multiple metal layers separated from one another by layers of dielectric material and interconnected by electrically conductive vias. In some embodiments, the interposer 1104 may be formed of an epoxy resin, a fiberglass-reinforced epoxy resin, an epoxy resin with inorganic fillers, a ceramic material, or a polymer material such as polyimide. In some embodiments, the interposer 1104 may be formed of alternate rigid or flexible materials that may include the same materials described above for use in a semiconductor substrate, such as silicon, germanium, and other group III-V and group IV materials. The interposer 1104 may include metal interconnects 1108 and vias 1110, including but not limited to through hole vias 1110-1 (that extend from a first face 1150 of the interposer 1104 to a second face 1154 of the interposer 1104), blind vias 1110-2 (that extend from the first or second faces 1150 or 1154 of the interposer 1104 to an internal metal layer), and buried vias 1110-3 (that connect internal metal layers).

In some embodiments, the interposer 1104 can comprise a silicon interposer. Through silicon vias (TSV) extending through the silicon interposer can connect connections on a first face of a silicon interposer to an opposing second face of the silicon interposer. In some embodiments, an interposer 1104 comprising a silicon interposer can further comprise one or more routing layers to route connections on a first face of the interposer 1104 to an opposing second face of the interposer 1104.

The interposer 1104 may further include embedded devices 1114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1104. The package-on-interposer structure 1136 may take the form of any of the package-on-interposer structures known in the art. In embodiments where the interposer is a non-printed circuit board The integrated circuit device assembly 1100 may include an integrated circuit component 1124 coupled to the first face 1140 of the circuit board 1102 by coupling components 1122. The coupling components 1122 may take the form of any of the embodiments discussed above with reference to the coupling components 1116, and the integrated circuit component 1124 may take the form of any of the embodiments discussed above with reference to the integrated circuit component 1120.

The integrated circuit device assembly 1100 illustrated in FIG. 11 includes a package-on-package structure 1134 coupled to the second face 1142 of the circuit board 1102 by coupling components 1128. The package-on-package structure 1134 may include an integrated circuit component 1126 and an integrated circuit component 1132 coupled together by coupling components 1130 such that the integrated circuit component 1126 is disposed between the circuit board 1102 and the integrated circuit component 1132. The coupling components 1128 and 1130 may take the form of any of the embodiments of the coupling components 1116 discussed above, and the integrated circuit components 1126 and 1132 may take the form of any of the embodiments of the integrated circuit component 1120 discussed above. The package-on-package structure 1134 may be configured in accordance with any of the package-on-package structures known in the art.

Figure 12:
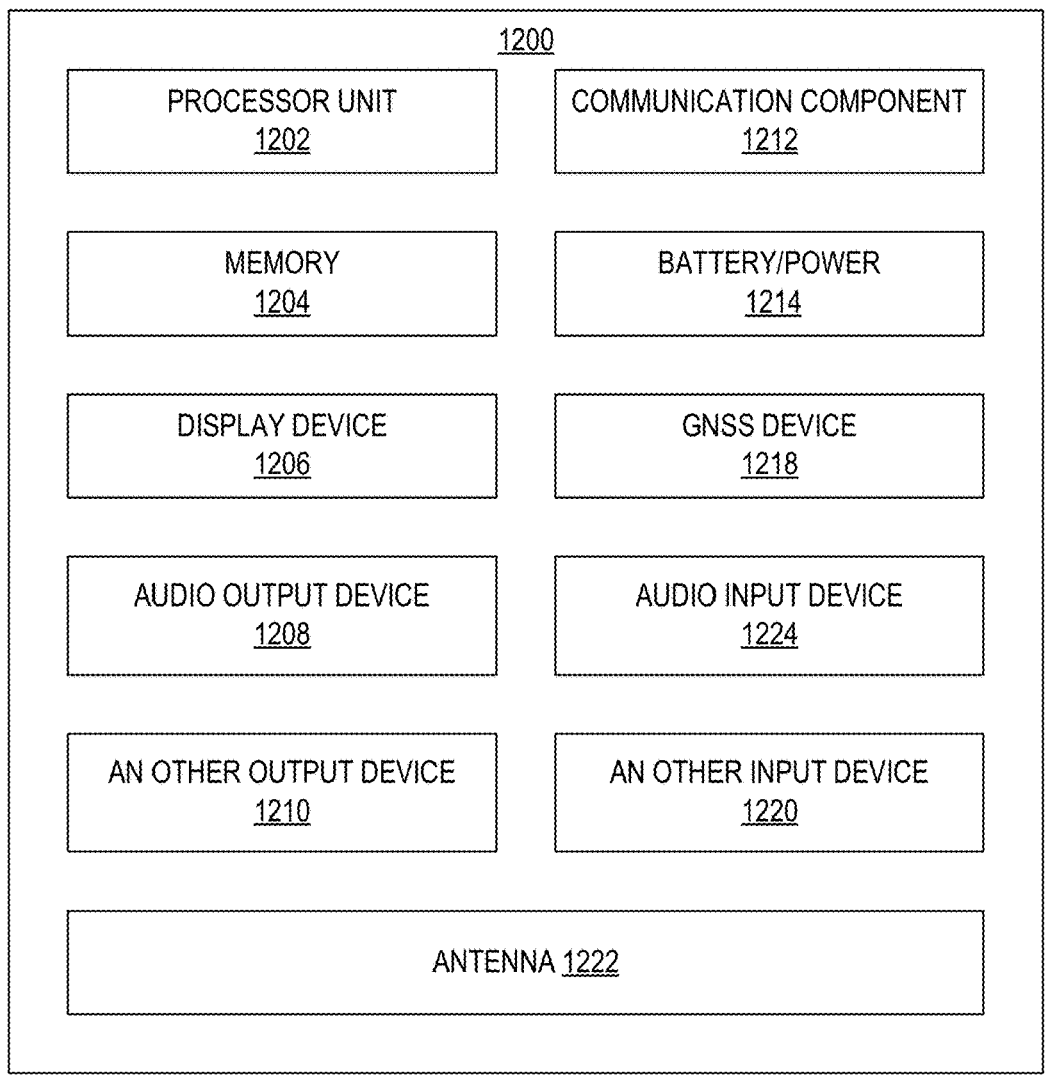
FIG. 12 is a block diagram of an example electrical device, in accordance with any of the embodiments disclosed herein.

FIG. 12 is a block diagram of an example electrical device 1200 that may include one or more of the systems 200 or quantum compute devices 200 disclosed herein. For example, any suitable ones of the components of the electrical device 1200 may include one or more of the integrated circuit device assemblies 1100, integrated circuit components 1120, integrated circuit devices 900, or integrated circuit dies 802 disclosed herein, and may be arranged in any of the quantum compute devices 200 disclosed herein. A number of components are illustrated in FIG. 12 as included in the electrical device 1200, but any one or more of these components may be omitted or duplicated, as suitable for the application. In some embodiments, some or all of the components included in the electrical device 1200 may be attached to one or more motherboards mainboards, or system boards. In some embodiments, one or more of these components are fabricated onto a single system-on-a-chip (SoC) die.

Additionally, in various embodiments, the electrical device 1200 may not include one or more of the components illustrated in FIG. 12, but the electrical device 1200 may include interface circuitry for coupling to the one or more components. For example, the electrical device 1200 may not include a display device 1206, but may include display device interface circuitry (e.g., a connector and driver circuitry) to which a display device 1206 may be coupled. In another set of examples, the electrical device 1200 may not include an audio input device 1224 or an audio output device 1208, but may include audio input or output device interface circuitry (e.g., connectors and supporting circuitry) to which an audio input device 1224 or audio output device 1208 may be coupled.

The electrical device 1200 may include one or more processor units 1202 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1202 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1200 may include a memory 1204, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1204 may include memory that is located on the same integrated circuit die as the processor unit 1202. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1200 can comprise one or more processor units 1202 that are heterogeneous or asymmetric to another processor unit 1202 in the electrical device 1200. There can be a variety of differences between the processing units 1202 in a system in terms of a spectrum of metrics of merit including architectural, microarchitectural, thermal, power consumption characteristics, and the like. These differences can effectively manifest themselves as asymmetry and heterogeneity among the processor units 1202 in the electrical device 1200.

In some embodiments, the electrical device 1200 may include a communication component 1212 (e.g., one or more communication components). For example, the communication component 1212 can manage wireless communications for the transfer of data to and from the electrical device 1200. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1212 may operate in accordance with other wireless protocols in other embodiments. The electrical device 1200 may include an antenna 1222 to facilitate wireless communications and/or to receive other wireless communications (such as AM or FM radio transmissions).

In some embodiments, the communication component 1212 may manage wired communications, such as electrical, optical, or any other suitable communication protocols (e.g., IEEE 802.3 Ethernet standards). As noted above, the communication component 1212 may include multiple communication components. For instance, a first communication component 1212 may be dedicated to shorter-range wireless communications such as Wi-Fi or Bluetooth, and a second communication component 1212 may be dedicated to longer-range wireless communications such as global positioning system (GPS), EDGE, GPRS, CDMA, WiMAX, LTE, EV-DO, or others. In some embodiments, a first communication component 1212 may be dedicated to wireless communications, and a second communication component 1212 may be dedicated to wired communications.

The electrical device 1200 may include battery/power circuitry 1214. The battery/power circuitry 1214 may include one or more energy storage devices (e.g., batteries or capacitors) and/or circuitry for coupling components of the electrical device 1200 to an energy source separate from the electrical device 1200 (e.g., AC line power).

The electrical device 1200 may include a display device 1206 (or corresponding interface circuitry, as discussed above). The display device 1206 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1200 may include an audio output device 1208 (or corresponding interface circuitry, as discussed above). The audio output device 1208 may include any embedded or wired or wirelessly connected external device that generates an audible indicator, such speakers, headsets, or earbuds.

The electrical device 1200 may include an audio input device 1224 (or corresponding interface circuitry, as discussed above). The audio input device 1224 may include any embedded or wired or wirelessly connected device that generates a signal representative of a sound, such as microphones, microphone arrays, or digital instruments (e.g., instruments having a musical instrument digital interface (MIDI) output). The electrical device 1200 may include a Global Navigation Satellite System (GNSS) device 1218 (or corresponding interface circuitry, as discussed above), such as a Global Positioning System (GPS) device. The GNSS device 1218 may be in communication with a satellite-based system and may determine a geolocation of the electrical device 1200 based on information received from one or more GNSS satellites, as known in the art.

The electrical device 1200 may include another output device 1210 (or corresponding interface circuitry, as discussed above). Examples of the other output device 1210 may include an audio codec, a video codec, a printer, a wired or wireless transmitter for providing information to other devices, or an additional storage device.

The electrical device 1200 may include another input device 1220 (or corresponding interface circuitry, as discussed above). Examples of the other input device 1220 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1200 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1200 may be any other electronic device that processes data. In some embodiments, the electrical device 1200 may comprise multiple discrete physical components. Given the range of devices that the electrical device 1200 can be manifested as in various embodiments, in some embodiments, the electrical device 1200 can be referred to as a computing device or a computing system.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

EXAMPLES

Illustrative examples of the technologies disclosed herein are provided below. An embodiment of the technologies may include any one or more, and any combination of, the examples described below.

Example 1 includes a system comprising a transmission gate comprising an input; an output; a first n-MOS transistor and a second n-MOS transistor, wherein a first source/drain region of the first n-MOS transistor is connected to the input, a second source/drain region of the first n-MOS transistor is connected to a first source/drain region of the second n-MOS transistor, and a second source/drain region of the second n-MOS transistor is connected to the output; a first p-MOS transistor and a second p-MOS transistor, wherein a first source/drain region of the first p-MOS transistor is connected to the input, a second source/drain region of the first p-MOS transistor is connected to a first source/drain region of the second p-MOS transistor, and a second source/drain region of the second p-MOS transistor is connected to the output; a first mid-point transistor, wherein a source/drain region of the first mid-point transistor is connected to the second source/drain region of the first n-MOS transistor and to the first source/drain region of the second n-MOS transistor; and a second mid-point transistor, wherein a source/drain region of the second mid-point transistor is connected to the second source/drain region of the first p-MOS transistor and to the first source/drain region of the second p-MOS transistor.

Example 2 includes the subject matter of Example 1, and further including control circuitry to apply a voltage to the input such that a voltage difference between the input and the output is greater than a breakdown voltage of transistors of the transmission gate; and control voltages applied to gates of the first n-MOS transistor, second n-MOS transistor, first p-MOS transistor, second p-MOS transistor, first mid-point transistor, and second mid-point transistor such that voltages across terminals of the first n-MOS transistor, second n-MOS transistor, first p-MOS transistor, second p-MOS transistor, first mid-point transistor, and second mid-point transistor do not exceed a breakdown voltage of the corresponding transistor.

Example 3 includes the subject matter of any of Examples 1 and 2, and wherein, when the transmission gate is off, the control circuitry is to apply a gate voltage to the first n-MOS transistor and the first p-MOS transistor based on a voltage at the input and apply a gate voltage to the second n-MOS transistor and the second n-MOS transistor based on a voltage at the output.

Example 4 includes the subject matter of any of Examples 1-3, and wherein, when the transmission gate is on, the control circuitry is to apply a gate voltage to the first n-MOS transistor, the second n-MOS transistor, the first p-MOS transistor, and the second p-MOS transistor based on a voltage at the input.

Example 5 includes the subject matter of any of Examples 1-4, and further including a digital-to-analog converter (DAC); and one or more switches, wherein the one or more switches connect an output of the DAC to the transmission gate, wherein the control circuitry is to control the DAC and the one or more switches to charge a capacitor connected to the transmission gate.

Example 6 includes the subject matter of any of Examples 1-5, and further including a plurality of transmission gates, wherein the plurality of transmission gates comprise the transmission gate; a multiplexer comprising an input and a plurality of outputs, wherein individual outputs of the plurality of outputs are connected to individual transmission gates of the plurality of transmission gates; a decoder circuit; and a plurality of wires connecting the control circuitry to the decoder circuit, wherein the number of plurality of wires is proportional to a logarithm of the number of transmission gates, wherein the decoder circuit is to select an output of the plurality of outputs based on signals in the plurality of wires.

Example 7 includes the subject matter of any of Examples 1-6, and wherein the plurality of transmission gates, the multiplexer, and the decoder circuit are integrated on a die.

Example 8 includes the subject matter of any of Examples 1-7, and wherein the die does not include an amplifier.

Example 9 includes the subject matter of any of Examples 1-8, and wherein individual switches of the one or more switches are transistors.

Example 10 includes the subject matter of any of Examples 1-9, and wherein the control circuitry is to apply a voltage to the input such that a voltage difference between the input and the output is greater than twice the breakdown voltage.

Example 11 includes the subject matter of any of Examples 1-10, and further including a quantum processor comprising a plurality of qubits, wherein the output is connected to the quantum processor.

Example 12 includes the subject matter of any of Examples 1-11, and wherein the transmission gate is capable of operation at a temperature less than 100 millikelvin.

Example 13 includes the subject matter of any of Examples 1-12, and further including control circuitry to apply a voltage to the input such that a voltage difference between the input and the output is greater than a breakdown voltage of transistors of the transmission gate; and control voltages applied to gates of the first n-MOS transistor, second n-MOS transistor, first p-MOS transistor, second p-MOS transistor, first mid-point transistor, and second mid-point transistor such that voltages across terminals of the first n-MOS transistor, second n-MOS transistor, first p-MOS transistor, second p-MOS transistor, first mid-point transistor, and second mid-point transistor do not exceed a breakdown voltage of the corresponding transistor, wherein the control circuitry is capable of operation at a temperature between 1 and 10 Kelvin.

Example 14 includes a system comprising a transmission gate comprising an input, and output, and a plurality of transistors, wherein the plurality of transistors facilitate controllable transmission of a voltage at the input to the output, wherein individual transistors of the plurality of transistors have a breakdown voltage; and control circuitry to apply a voltage to the input such that a voltage difference between the input and the output is greater than the breakdown voltage; and control voltages applied to individual transistors of the plurality of transistors such that voltages across terminals of individual transistors of the plurality of transistors do not exceed the breakdown voltage.

Example 15 includes the subject matter of Example 14, and wherein, when the transmission gate is off, the control circuitry is to apply a gate voltage to one or more transistors connected to the input based on a voltage at the input and apply a gate voltage to one or more transistors connected to the output based on a voltage at the output.

Example 16 includes the subject matter of any of Examples 14 and 15, and wherein, when the transmission gate is on, the control circuitry is to apply a gate voltage to one or more transistors connected to the input and one or more transistors connected to the output based on a voltage at the input.

Example 17 includes the subject matter of any of Examples 14-16, and further including a digital-to-analog converter (DAC); and one or more switches, wherein the one or more switches connect an output of the DAC to the transmission gate, wherein the control circuitry is to control the DAC and the one or more switches to charge a capacitor connected to the transmission gate.

Example 18 includes the subject matter of any of Examples 14-17, and further including a plurality of transmission gates, wherein the plurality of transmission gates comprise the transmission gate; a multiplexer comprising an input and a plurality of outputs, wherein individual outputs of the plurality of outputs are connected to individual transmission gates of the plurality of transmission gates; a decoder circuit; and a plurality of wires connecting the control circuitry to the decoder circuit, wherein the number of plurality of wires is proportional to a logarithm of the number of transmission gates, wherein the decoder circuit is to select an output of the plurality of outputs based on signals in the plurality of wires.

Example 19 includes the subject matter of any of Examples 14-18, and wherein the plurality of transmission gates, the multiplexer, and the decoder circuit are integrated on a die.

Example 20 includes the subject matter of any of Examples 14-19, and wherein the die does not include an amplifier.

Example 21 includes the subject matter of any of Examples 14-20, and wherein individual switches of the one or more switches are transistors.

Example 22 includes the subject matter of any of Examples 14-21, and wherein the control circuitry is to apply a voltage to the input such that a voltage difference between the input and the output is greater than three times the breakdown voltage.

Example 23 includes the subject matter of any of Examples 14-22, and further including a quantum processor comprising a plurality of qubits, wherein the output is connected to the quantum processor.

Example 24 includes the subject matter of any of Examples 14-23, and wherein the transmission gate is capable of operation at a temperature less than 100 millikelvin.

Example 25 includes the subject matter of any of Examples 14-24, and wherein the control circuitry is capable of operation at a temperature between 1 and 10 Kelvin.

Example 26 includes a system comprising a transmission gate comprising an input, and output, and a plurality of transistors, wherein the plurality of transistors facilitate controllable transmission of a voltage at the input to the output, wherein individual transistors of the plurality of transistors have a breakdown voltage; and means for controlling voltages applied to individual transistors of the plurality of transistors such that voltages across terminals of individual transistors of the plurality of transistors do not exceed the breakdown voltage while a voltage at the input exceeds the breakdown voltage.

Example 27 includes the subject matter of Example 26, and wherein, when the transmission gate is off, the means for controlling voltages is to apply a gate voltage to one or more transistors connected to the input based on a voltage at the input and apply a gate voltage to one or more transistors connected to the output based on a voltage at the output.

Example 28 includes the subject matter of any of Examples 26 and 27, and wherein, wherein, when the transmission gate is on, the means for controlling voltages is to apply a gate voltage to one or more transistors connected to the input and one or more transistors connected to the output based on a voltage at the input.

Example 29 includes the subject matter of any of Examples 26-28, and further including a digital-to-analog converter (DAC); and one or more switches, wherein the one or more switches connect an output of the DAC to the transmission gate, wherein the means for controlling voltages is to control the DAC and the one or more switches to charge a capacitor connected to the transmission gate.

Example 30 includes the subject matter of any of Examples 26-29, and further including a plurality of transmission gates, wherein the plurality of transmission gates comprise the transmission gate; a multiplexer comprising an input and a plurality of outputs, wherein individual outputs of the plurality of outputs are connected to individual transmission gates of the plurality of transmission gates; a decoder circuit; and a plurality of wires connecting the means for controlling voltages to the decoder circuit, wherein the number of plurality of wires is proportional to a logarithm of the number of transmission gates, wherein the decoder circuit is to select an output of the plurality of outputs based on signals in the plurality of wires.

Example 31 includes the subject matter of any of Examples 26-30, and wherein the plurality of transmission gates, the multiplexer, and the decoder circuit are integrated on a die.

Example 32 includes the subject matter of any of Examples 26-31, and wherein the die does not include an amplifier.

Example 33 includes the subject matter of any of Examples 26-32, and wherein individual switches of the one or more switches are transistors.

Example 34 includes the subject matter of any of Examples 26-33, and wherein the means for controlling voltages is to apply a voltage to the input such that a voltage difference between the input and the output is greater than three times the breakdown voltage.

Example 35 includes the subject matter of any of Examples 26-34, and further including a quantum processor comprising a plurality of qubits, wherein the output is connected to the quantum processor.

Example 36 includes the subject matter of any of Examples 26-35, and wherein the transmission gate is capable of operation at a temperature less than 100 millikelvin.

Example 37 includes the subject matter of any of Examples 26-36, and wherein the means for controlling voltages is capable of operation at a temperature between 1 and 10 Kelvin.

The invention claimed is:

1. A system comprising:
    a transmission gate comprising:
        an input;
        an output;
        a first n-MOS transistor and a second n-MOS transistor, wherein a first source/drain region of the first n-MOS transistor is connected to the input, a second source/drain region of the first n-MOS transistor is connected to a first source/drain region of the second n-MOS transistor, and a second source/drain region of the second n-MOS transistor is connected to the output;
        a first p-MOS transistor and a second p-MOS transistor, wherein a first source/drain region of the first p-MOS transistor is connected to the input, a second source/drain region of the first p-MOS transistor is connected to a first source/drain region of the second p-MOS transistor, and a second source/drain region of the second p-MOS transistor is connected to the output;
        a mid-point transistor, wherein a source/drain region of the mid-point transistor is connected to the second source/drain region of the first n-MOS transistor and to the first source/drain region of the second n-MOS transistor; and
    control circuitry to:
        apply a voltage to the input such that a voltage difference between the input and the output is greater than a breakdown voltage of transistors of the transmission gate; and
        control voltages applied to gates of the first n-MOS transistor, second n-MOS transistor, first p-MOS transistor, second p-MOS transistor, and mid-point transistor such that voltages across terminals of the first n-MOS transistor, second n-MOS transistor, first p-MOS transistor, second p-MOS transistor, and mid-point transistor do not exceed a breakdown voltage of the corresponding transistor,
    wherein, when the transmission gate is off, the control circuitry is to apply a gate voltage to the first n-MOS transistor and the first p-MOS transistor based on a voltage at the input and apply a gate voltage to the second n-MOS transistor and the second p-MOS transistor based on a voltage at the output.

2. The system of claim 1, wherein, when the transmission gate is on, the control circuitry is to apply a gate voltage to the first n-MOS transistor, the second n-MOS transistor, the first p-MOS transistor, and the second p-MOS transistor based on a voltage at the input.

3. The system of claim 1, further comprising:
    a digital-to-analog converter (DAC); and
    one or more switches, wherein the one or more switches connect an output of the DAC to the transmission gate, wherein the control circuitry is to control the DAC and the one or more switches to charge a capacitor connected to the transmission gate.

4. The system of claim 3, further comprising:
    a plurality of transmission gates, wherein the plurality of transmission gates comprise the transmission gate;
    a multiplexer comprising an input and a plurality of outputs, wherein individual outputs of the plurality of outputs are connected to individual transmission gates of the plurality of transmission gates;
    a decoder circuit; and
    a plurality of wires connecting the control circuitry to the decoder circuit, wherein the number of plurality of wires is proportional to a logarithm of the number of transmission gates,
    wherein the decoder circuit is to select an output of the plurality of outputs based on signals in the plurality of wires.

5. The system of claim 4, wherein the plurality of transmission gates, the multiplexer, and the decoder circuit are integrated on a die.

6. The system of claim 5, wherein the die does not include an amplifier.

7. The system of claim 3, wherein individual switches of the one or more switches are transistors.

8. The system of claim 1, wherein the control circuitry is to apply a voltage to the input such that a voltage difference between the input and the output is greater than twice the breakdown voltage.

9. The system of claim 1, further comprising a quantum processor comprising a plurality of qubits, wherein the output is connected to the quantum processor.

10. The system of claim 1, wherein the transmission gate is capable of operation at a temperature less than 100 millikelvin.

11. The system of claim 10, further comprising control circuitry to:
    apply a voltage to the input such that a voltage difference between the input and the output is greater than a breakdown voltage of transistors of the transmission gate; and control voltages applied to gates of the first n-MOS transistor, second n-MOS transistor, first p-MOS transistor, second p-MOS transistor, and mid-point transistor such that voltages across terminals of the first n-MOS transistor, second n-MOS transistor, first p-MOS transistor, second p-MOS transistor, and mid-point transistor do not exceed a breakdown voltage of the corresponding transistor, wherein the control circuitry is capable of operation at a temperature between 1 and 10 Kelvin.

12. A system comprising:

a transmission gate comprising an input, and output, and a plurality of transistors, wherein the plurality of transistors facilitate controllable transmission of a voltage at the input to the output, wherein individual transistors of the plurality of transistors have a breakdown voltage; and control circuitry to:

apply a voltage to the input such that a voltage difference between the input and the output is greater than the breakdown voltage; and control voltages applied to individual transistors of the plurality of transistors such that voltages across terminals of individual transistors of the plurality of transistors do not exceed the breakdown voltage, wherein, when the transmission gate is off, the control circuitry is to apply a gate voltage to one or more transistors connected to the input based on a voltage at the input and apply a gate voltage to one or more transistors connected to the output based on a voltage at the output.

13. The system of claim 12, wherein, when the transmission gate is on, the control circuitry is to apply a gate voltage to one or more transistors connected to the input and one or more transistors connected to the output based on a voltage at the input.

14. The system of claim 12, further comprising:

a digital-to-analog converter (DAC); and one or more switches, wherein the one or more switches connect an output of the DAC to the transmission gate, wherein the control circuitry is to control the DAC and the one or more switches to charge a capacitor connected to the transmission gate.

15. The system of claim 14, further comprising:

a plurality of transmission gates, wherein the plurality of transmission gates comprise the transmission gate;

a multiplexer comprising an input and a plurality of outputs, wherein individual outputs of the plurality of outputs are connected to individual transmission gates of the plurality of transmission gates;

a decoder circuit; and a plurality of wires connecting the control circuitry to the decoder circuit, wherein the number of plurality of wires is proportional to a logarithm of the number of transmission gates, wherein the decoder circuit is to select an output of the plurality of outputs based on signals in the plurality of wires.

16. The system of claim 15, wherein the plurality of transmission gates, the multiplexer, and the decoder circuit are integrated on a die.

17. The system of claim 12, wherein the control circuitry is to apply a voltage to the input such that a voltage difference between the input and the output is greater than three times the breakdown voltage.

18. The system of claim 12, further comprising a quantum processor comprising a plurality of qubits, wherein the output is connected to the quantum processor.

19. A system comprising:

a transmission gate comprising an input, and output, and a plurality of transistors, wherein the plurality of transistors facilitate controllable transmission of a voltage at the input to the output, wherein individual transistors of the plurality of transistors have a breakdown voltage; and means for controlling voltages applied to individual transistors of the plurality of transistors such that voltages across terminals of individual transistors of the plurality of transistors do not exceed the breakdown voltage while a voltage at the input exceeds the breakdown voltage, wherein, when the transmission gate is on, the means for controlling voltages is to apply a gate voltage to one or more transistors connected to the input and one or more transistors connected to the output based on a voltage at the input.

20. The system of claim 19, wherein, when the transmission gate is off, the means for controlling voltages is to apply a gate voltage to one or more transistors connected to the input based on a voltage at the input and apply a gate voltage to one or more transistors connected to the output based on a voltage at the output.

21. The system of claim 19, wherein the means for controlling voltages is to apply a voltage to the input such that a voltage difference between the input and the output is greater than three times the breakdown voltage.

22. The system of claim 1, further comprising:

a second mid-point transistor, wherein a source/drain region of the second mid-point transistor is connected to the second source/drain region of the first p-MOS transistor and to the first source/drain region of the second p-MOS transistor.

23. The system of claim 12, wherein the transmission gate is capable of operation at a temperature less than 100 millikelvin.

24. The system of claim 23, wherein the control circuitry is capable of operation at a temperature between 1 and 10 Kelvin.

25. The system of claim 16, wherein the die does not include an amplifier.

* * * * *